United States Patent
Shih et al.

(10) Patent No.: US 8,238,149 B2
(45) Date of Patent: Aug. 7, 2012

(54) METHODS AND APPARATUS FOR REDUCING DEFECT BITS IN PHASE CHANGE MEMORY

(75) Inventors: Yen-Hao Shih, Elmsford, NY (US); Ming-Hsiu Lee, Hsinchu (TW); Chao-I Wu, Zhubei (TW); Hsiang-Lan Lung, Dobbs Ferry, NY (US); Chung Hon Lam, Peekskill, NY (US); Roger Cheek, Somers, NY (US); Matthew J. Breitwisch, Yorktown Heights, NY (US); Bipin Rajendran, New York, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 256 days.

(21) Appl. No.: 12/715,802

(22) Filed: Mar. 2, 2010

(65) Prior Publication Data
US 2010/0328995 A1  Dec. 30, 2010

Related U.S. Application Data

(60) Provisional application No. 61/220,515, filed on Jun. 25, 2009.

(51) Int. Cl.
*G11C 11/00* (2006.01)
(52) U.S. Cl. .................................. 365/163; 365/148
(58) Field of Classification Search .............. 365/100, 365/113, 115, 148, 163
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 3,846,767 | A | 11/1974 | Cohen |
| 4,452,592 | A | 6/1984 | Tsai |
| 4,599,705 | A | 7/1986 | Holmberg et al. |
| 4,719,594 | A | 1/1988 | Young et al. |
| 4,769,339 | A | 9/1988 | Ishii |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |

(Continued)

FOREIGN PATENT DOCUMENTS

WO  2004025659 A1  3/2004

OTHER PUBLICATIONS

Strauss, Karl F. et al., "Overview of Radiation Tolerant Unlimited Write Cycle Non-Volatile Memory," IEEE Mar. 18-25, 2000, pp. 399-408.

(Continued)

*Primary Examiner* — Gene Auduong
(74) *Attorney, Agent, or Firm* — Haynes Beffel & Wolfeld LLP

(57) ABSTRACT

Phase change memory devices and methods for operating described herein are based on the discovery that, following an initial high current operation applied to a phase change memory cell to establish the high resistance reset state, the current-voltage (I-V) behavior of the memory cell under different bias voltages can be used to detect if the memory cell is a defect cell having poor data retention characteristics.

20 Claims, 18 Drawing Sheets

U.S. PATENT DOCUMENTS

| | | |
|---|---|---|
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,841,150 A | 11/1998 | Gonzalez et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,473,332 B1 | 10/2002 | Ignatiev et al. |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,521,973 B2 | 2/2003 | Sharples et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,116,593 B2 | 10/2006 | Hanzawa et al. |
| 7,122,281 B2 | 10/2006 | Pierrat |

| Patent No. | Date | Inventor |
|---|---|---|
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,427,531 B2 | 9/2008 | Cho et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,488,968 B2 | 2/2009 | Lee |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,535,756 B2 * | 5/2009 | Lung .................. 365/163 |
| 7,551,473 B2 | 6/2009 | Lung et al. |
| 7,569,844 B2 | 8/2009 | Lung |
| 7,623,370 B2 | 11/2009 | Toda et al. |
| 7,651,906 B2 | 1/2010 | Park et al. |
| 7,683,360 B2 | 3/2010 | Chen et al. |
| 7,688,619 B2 | 3/2010 | Lung et al. |
| 7,696,503 B2 | 4/2010 | Lung et al. |
| 7,701,759 B2 | 4/2010 | Lung et al. |
| 7,868,313 B2 | 1/2011 | Breitwisch et al. |
| 7,869,270 B2 * | 1/2011 | Lee .................. 365/163 |
| 8,036,014 B2 * | 10/2011 | Lee et al. .................. 365/148 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2003/0211732 A1 | 11/2003 | Chiang |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0186483 A1 | 8/2006 | Cho et al. |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0034908 A1 * | 2/2007 | Cho et al. .................. 257/260 |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |

| | | |
|---|---|---|
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1* | 7/2008 | Lung .......................... 365/163 |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Lung et al. |
| 2008/0280401 A1 | 11/2008 | Burr et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166600 A1 | 7/2009 | Park et al. |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |
| 2010/0270529 A1 | 10/2010 | Lung |
| 2010/0291747 A1 | 11/2010 | Lung et al. |
| 2010/0328995 A1 | 12/2010 | Shih et al. |
| 2010/0328996 A1 | 12/2010 | Shih et al. |
| 2011/0013446 A1 | 1/2011 | Lung |
| 2011/0034003 A1 | 2/2011 | Lung |
| 2011/0049456 A1 | 3/2011 | Lung et al. |

OTHER PUBLICATIONS

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era- vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Gleixner, B., et al. "Data Retention Characterization of Phase-Change Memory Arrays," 45th Annual, IEEE Int'l Apr. 15-19, 2007, pp. 542-546.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mantegazza, D., et al., "Electrical Characterization of Anomalous Cells in Phase Change Memory Arrays," IEEE IEDM Technical Digest,, pp. 53-56, Dec. 11-13, 2006.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Oh, J.H., et al., "Full Integration of Highly Manufacturable 512Mb PRAM based on 90nm Technology," IEEE IEDM Technical Digest, pp. 49-52, Dec. 11-13, 2006.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Shih, Y.H., et al., "Mechanisms of Retention Loss in Ge2Sb2Te5-based Phase-Change Memory," IEEE IEDM pp. 1-4, Dec. 15-17, 2008.

* cited by examiner

METHODS AND APPARATUS FOR REDUCING DEFECT BITS IN PHASE CHANGE MEMORY

CROSS-REFERENCE TO RELATED APPLICATIONS

This application claims the benefit of U.S. Provisional Application No. 61/220,515 titled "Methods for Reducing Defect Bits and Early Failure Bits in Phase Change Memory" filed 25 Jun. 2009, which is incorporated by reference herein.

PARTIES TO A JOINT RESEARCH AGREEMENT

International Business Machines Corporation, a New York corporation, and Macronix International Corporation, Ltd., a Taiwan corporation are parties to a Joint Research Agreement.

BACKGROUND OF THE INVENTION

1. Field of the Invention

The present invention relates to memory devices based on phase change based memory material, including chalcogenide materials and other programmable resistive materials, and to methods for operating such devices.

2. Description of Related Art

Phase change based memory materials, like chalcogenide materials and similar materials, can be caused to change phase between an amorphous and a crystalline phase by application of electrical current at levels suitable for implementation in integrated circuits. The generally amorphous phase is characterized by higher electrical resistivity than the generally crystalline phase, which can be readily sensed to indicate data. These properties have generated interest in using phase change based material to form nonvolatile memory circuits, which can be read and written with random access.

In phase change memory, data is stored by causing transitions in an active region of the phase change material between amorphous and crystalline phases. FIG. 1 is an example distribution of the resistance for a number of memory cells having one of two resistance states (storing a single bit of data). The memory cells each include a phase change memory element which is programmable to a high resistance reset state 102 and a lower resistance set state 100. Each resistance state corresponds to a non-overlapping resistance range. In multi-bit operation the phase change memory elements are programmable to more than two resistance states.

The change from the high resistance state 102 to the lower resistance state 100, referred to as set herein, is generally a lower current operation in which current heats the phase change material above a transition temperature to cause a transition of the active region from the amorphous to the crystalline phase. The change from the lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

The difference between the highest resistance $R_1$ of the lower resistance state 100 and the lowest resistance $R_2$ of the high resistance state 102 defines a read margin used to distinguish cells in the lower resistance state 100 from those in the high resistance state 102. The data stored in a memory cell can be determined by determining whether the memory cell has a resistance corresponding to the lower resistance state 100 or to the high resistance state 102, for example by sensing whether the resistance of the memory cell is above or below a threshold resistance value $R_{SA}$ 103 within the read margin.

One problem arising in phase change memory devices involves data retention in the high resistance state 102. Specifically, memory cells in the high resistance state 102 can suffer a decrease in resistance, as the active region shifts from amorphous phase to crystalline phase, due to re-crystallization of small portions of the active region. The rate of decrease in resistance depends on a number of factors, including variations in structure and materials across an array, manufacturing defects and environmental conditions to which the device is exposed.

It has been observed that a number of memory cells in an array initially exhibit, or will develop after repeated reset and/or set operations, persistently short retention times in the high resistance state 102, as its resistance quickly decreases over time to below the threshold resistance value $R_{SA}$ 103. As a result, when these memory cells (referred to herein as defect cells) are read the lower resistance state 100 will be detected, resulting in bit errors.

Defect cells can arise due to variations in materials and manufacturing processes which result in different reset characteristics among the memory cells in an array, including differences in the amount of current required to reset the memory cells. For example, variations in structure across an array, such as variations in the shape and size of electrodes and phase change material elements, result in differences in current density within the phase change material elements. As a result, the active regions of the memory cells across the array are subject to different thermal and electrical conditions, resulting in a wide variation in the amount of amorphous phase material in the active regions. This will result in some memory cells (defect cells) in the high resistance state 102 having a comparatively small amount of amorphous phase material in their active regions, for example having a large concentration of crystalline phase material, and/or having a relatively small active region size. As a result, after a relatively short amount of time, a low resistance crystalline phase path can be formed through the active regions of these defect cells, resulting in bit errors. Furthermore, because phase change memory resistance depends upon a number of factors, the memory cells which will experience a rapid decrease in resistance and are thus defect cells may not be identified based on their initial resistance value.

Attempts at addressing the differences in the amount of current required to reset the memory cells include choosing a single, suitably high reset current. However, this results in at least some of the memory cells receiving significantly higher current levels than are necessary to cause a transition to the higher resistance state 102, referred to herein as being "over-reset". Since the phase change material undergoes a phase change as a result of heating, using unnecessarily high current levels can result in electrical and mechanical reliability problems for the memory cells. These problems include the formation of voids at the phase change material/electrode interfaces due to mechanical stress caused by thermal expansion and material density changes during operation. Additionally, using significantly higher current levels than necessary can result in problems such as localized heating sufficient to induce diffusion/reaction of electrode and phase change material, and/or cause compositional changes in the phase change material within the active region, resulting resistive switching degradation and possible failure of the memory cell.

Defect cells can also arise due to a persistently small retention time in the high resistance state 102 which develops during the life of the device. For example, the amount of amorphous phase material may decrease in response to a given reset operation following repeated set and reset operations, due to compositional changes within the phase change material and diffusion/reaction of electrode material and phase change material.

It is therefore desirable to provide phase change based memory devices and methods for operating which address the data retention issues caused by defect cells.

SUMMARY

Phase change memory devices and methods for operating described herein are based on the discovery that, following an initial high current operation applied to a phase change memory cell to establish the high resistance reset state, the current-voltage (I-V) behavior of the memory cell for different bias voltages can be used to detect if the memory cell is a defect cell having poor data retention characteristics.

A method is described herein for operating a memory cell comprising phase change material and programmable to a plurality of resistance states including a higher resistance state and a lower resistance state. The method includes applying a first bias arrangement to the memory cell to establish the higher resistance state. A first voltage is applied to induce a first current in the memory cell. A second voltage is applied to induce a second current in the memory cell, the second voltage different from the first voltage. A second bias arrangement is then selectively applied to the memory cell to establish the higher resistance state based on the first and second currents. For example, the second bias arrangement to the memory cell can be applied if a difference between the first and second currents is above a particular value, where the particular value is used to indicate that the memory cell may be a defect cell.

A memory device as described herein includes a memory cell comprising phase change material and programmable to a plurality of resistance states including a higher resistance state and a lower resistance state. The device includes bias circuitry to apply a first bias arrangement to the memory cell to establish the higher resistance state, to apply a first voltage to the memory cell to induce a first current in the memory cell, to apply a second voltage to the memory cell different from the first voltage to induce a second current in the memory cell, and to apply a second bias arrangement to memory cell to establish the higher resistance state in response to a command signal. The device further includes sense circuitry to sense the first and second currents, and control circuitry to generate the command signal based on the first and second currents, for example if a sensed difference between the first and second currents is above a particular value.

If the I-V behavior indicates that the memory cell may be a defect cell, techniques described herein include applying an additional high current operation to establish the high resistance reset state. The additional high current operation can increase the amount of amorphous phase material within the active region, for example by having a higher pulse amplitude, and/or a shorter pulse tail, than that of the initial high current operation. As a result, a memory cell which is a defect cell following the initial high current operation can be properly reset by the additional high current operation. As a result, the techniques described herein overcome the data retention issues of defect cells caused by having a small amount of amorphous phase material, and thus extend the useful life of the memory cells. In addition, since the additional high current operation is applied only if the memory cell is a defect cell, issues such as over-resetting of memory cells which have been properly reset by the initial high current operation are avoided.

If, following the additional high current operation, the I-V behavior of the memory cell still indicates that the memory cell is a defect cell, one or more further attempts can be made to increase the amount of amorphous phase material within the active region by applying further high current operations. If a predetermined number of high current operations have been applied to the memory cell, and its I-V behavior still indicates that the memory cell is a defect cell, the memory cell is then replaced using redundancy techniques.

Other aspects and advantages of the present invention can be seen on review of the drawings, the detailed description, and the claims which follow.

DETAILED DESCRIPTION

A detailed description of embodiments of the present invention is provided with reference to the FIGS. 2A-2B to 14A-14C.

Figure 1:
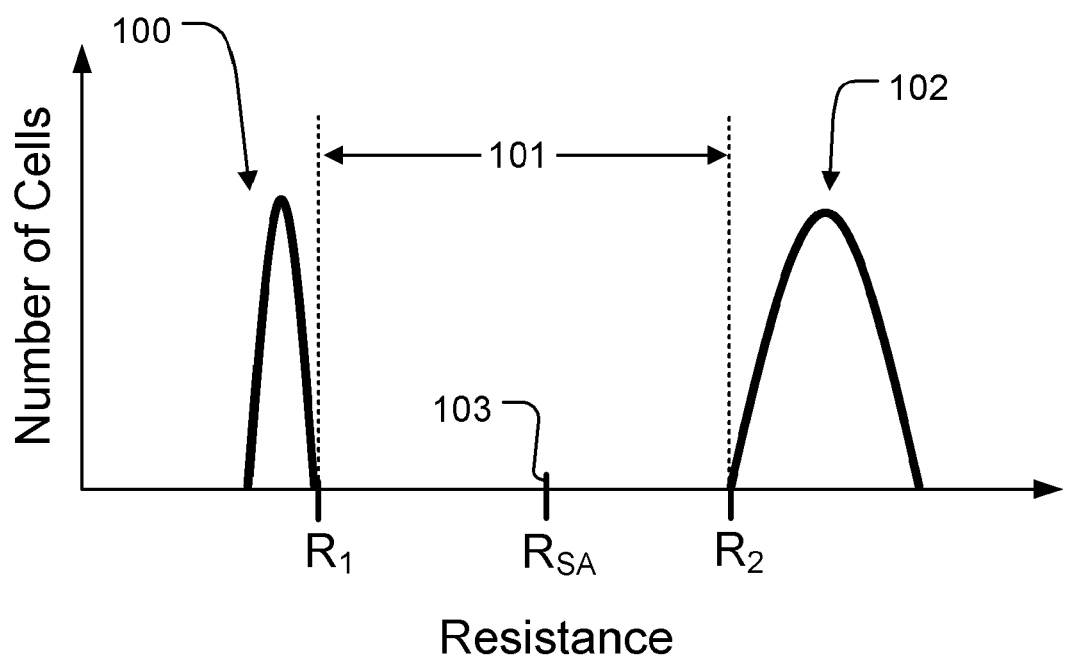
FIG. 1 is an example distribution of the resistance for a number of memory cells having one of two resistance states.
Figure 2:
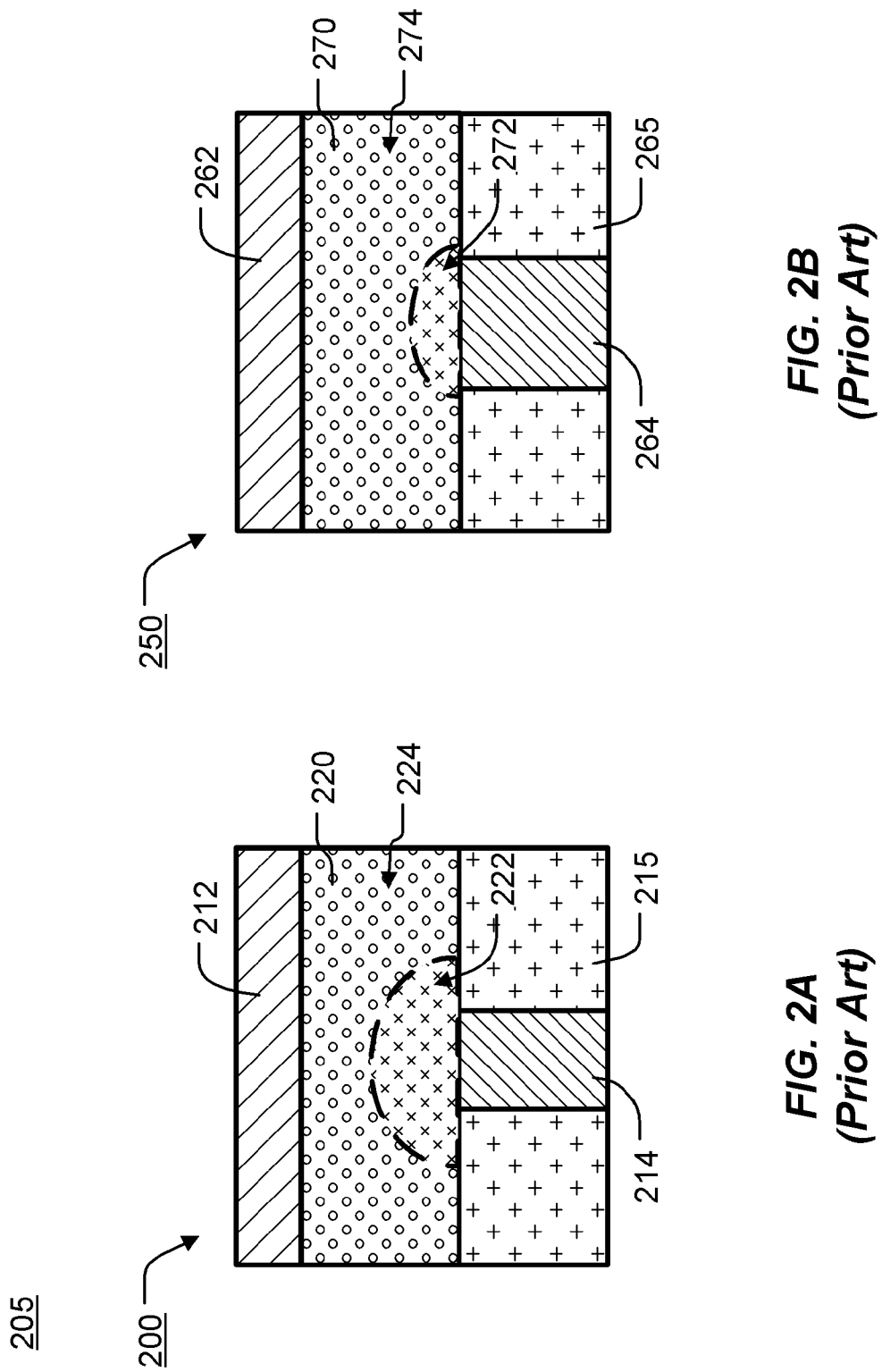
FIGS. 2A-2B illustrate cross-sectional views of two prior art "mushroom-type" memory cells.

FIGS. 2A-2B illustrates cross-sectional views of two prior art "mushroom type" memory cells 200, 250 in an array 205 that can include millions of memory cells. The first memory cell 200 includes a bottom electrode 214 extending through dielectric 215, a memory element 220 comprising a phase change material, and a top electrode 212 on the memory element 224. The bottom electrode 224 is coupled to a terminal of an access device (not shown) such as a diode or transistor, while the top electrode 212 is coupled to a bit line or can be part of a bit line. The bottom electrode 214 has a width less than the width of the top electrode 212 and memory element 220, establishing a small contact area between the memory element 220 and the bottom electrode 214 and a relatively large contact area between the memory element 220 and the top electrode 212.

In operation, voltages on the top and bottom electrodes 212, 214 induce a current to flow from the top electrode 212 to the bottom electrode 214, or vice versa, via the memory element 220. The active region 222 is the region of the memory element 220 in which the phase change material is induced to change between at least two solid phases. Due to the smaller contact area at the bottom electrode 214, in operation the current density is largest in the region of the memory element 220 adjacent the bottom electrode 214, resulting in the active region 222 having a "mushroom" shape as shown in FIG. 2A.

In a reset operation of the memory cell 200, voltages or current applied to the top and bottom electrodes 212, 214 of suitable amplitude and duration induce a current to flow through the memory element 220. The current raises the temperature of the active region 222 above the transition temperature of the phase change material and also above the melting temperature. The current is then terminated, after which the phase change material cools quickly, quenching the phase change process and allowing the active region 222 to stabilize in the generally amorphous phase.

FIG. 2A illustrates heuristically, the memory cell 200 in the high resistance reset state. In the high resistance reset state, the memory element 224 has a generally amorphous active region 222 with a random distribution of crystalline regions within the active region 222. The memory element 222 includes a generally crystalline inactive region 224 outside the active region 222.

The second memory cell 250, illustrated in FIG. 2B, is similar to the first memory cell 200. The second memory cell 250 includes a bottom electrode 264 extending through dielectric 265, a memory element 270 comprising a phase change material, and a top electrode 262 on the memory element 274.

Variations in materials and manufacturing processes will result in variations in the shape and size of electrodes, and in the phase change material elements, across the memory cells in the array 205. For example, as shown in FIGS. 2A and 2B, variations in the processes used to form the bottom electrodes 264, 214 will result in differences in the widths of the bottom electrodes 264, 214. This in turn results in differences in the contact area between the bottom electrode 264 and the memory element 270, and the contact area between the bottom electrode 214 and the memory element 220. Since the contact area affects the current density within the phase change material, variations in the contact areas result in significant variations in the operation of the memory cells 250, 200.

FIG. 2B illustrates heuristically, memory cell 250 in the high resistance reset state following the same reset operation that was applied to the memory cell 200.

As illustrated in FIG. 2B, the larger contact area for the memory cell 250 results in a lower current density within the memory element 270. In addition, because the phase change occurs as a result of heating, the large contact area for the memory cell 250 will act to draw more heat away from the active region 272 and result in a significant amount of heat loss. Thus, as shown in FIGS. 2A and 2B, when the same reset operation is applied to both memory cells 250, 200, the larger bottom electrode 264 results in a smaller active region 272 in the memory cell 250 than the active region 222 in the memory cell 200.

The small active region 272 results in data retention issues and bit errors because of the drift in resistance as small portions of the active region 272 re-crystallize, due to environmental conditions to which the device is exposed. Thus, after a relatively short amount of time, a low resistance crystalline phase path can be formed through the small active region 272 of the memory cell 250, lowering the resistance of the memory cell 250 and resulting in a bit error. Thus, the small active region 272 results in the memory cell 250 being a defect cell. The data retention problems of defect cells due to a small active region are not limited to mushroom-type memory cells, and similar issues arise in other types of memory cell structures.

Furthermore, because phase change memory resistance depends upon a number of factors such as trap density and trap depth in addition to the amount of amorphous and crystalline phase material, the defect memory cells which will experience a rapid decrease in resistance may not be identified based on an initial resistance value prior to the low resistance crystalline phase path being formed.

In addition to defect cells which exhibit persistently short retention times in the high resistance state 102 due to manufacturing variations and defects, memory cells can also develop persistently short retention times after repeated reset and/or set operations over the life of the device. For example, in response to a given reset operation the size of the active region may decrease following repeated set and reset operations, due to compositional changes within the phase change material and diffusion/reaction of electrode material and phase change material within the active region.

Figure 3:
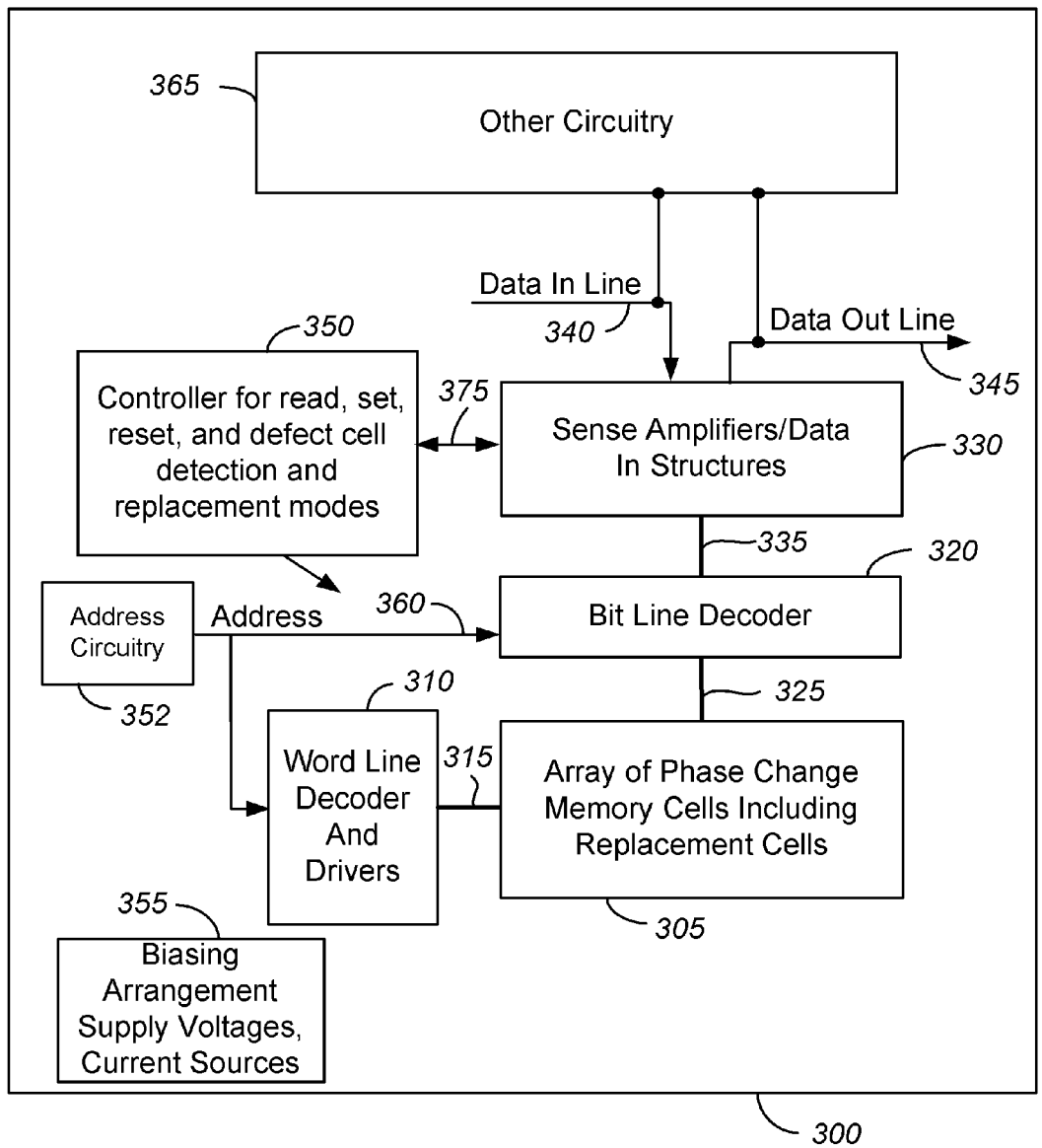
FIG. 3 is a simplified block diagram of an integrated circuit including resources to execute a defect cell detection and replacement process of the memory cells in an array.

FIG. 3 is a simplified block diagram of an integrated circuit 300 including logic to execute a defect cell detection and replacement process described in more detail below.

The integrated circuit 300 includes a memory array 305 implemented using phase change memory cells (not shown). A word line decoder and drivers 310 having read, set, reset, and defect cell detection and replacement modes is coupled to and in electrical communication with a plurality of word lines 315 arranged along rows in the memory array 305. A bit line (column) decoder 320 is in electrical communication with a plurality of bit lines 325 arranged along columns in the array for reading, setting, and resetting of the phase change memory cells in the array 305. Sense amplifiers and data-in structures in block 330 are coupled to bit line decoder 320 via data bus 335. Data is supplied via a data-in line 340 from input/output ports on the integrated circuit 300, or from other data sources internal or external to the integrated circuit 300, to data-in structures in block 330. Other circuitry 365 may be included on integrated circuit 300, such as a general purpose processor or special purpose application circuitry, or a combination of modules providing system-on-a-chip functionality supported by array 305. Data is supplied via a data-out line 345 from the sense amplifiers in block 330 to input/output ports on the integrated circuit 300, or to other data destinations internal or external to integrated circuit 300.

Memory redundancy for the defect cell detection and replacement process is supported by resources on the integrated circuit 300 including a set of replacement memory cells in the array 305, bit line decoder 320 for selecting replacement cells, and sense amplifiers of block 330 for outputting the results sensed from selected replacement cells.

Address circuitry 352 provides addresses on bus 360 to the word line decoder and drivers 310 and the bit line decoder 320. Addresses of defective memory cells in the array 305 are stored on the integrated circuit 300 using for example non-volatile memory cells that are programmed during testing and operation of the integrated circuit 300. The addresses of bit lines of defect cells in the array are used by the address circuitry to reroute addresses of defect cells into addresses of replacement cells in the array 305.

The integrated circuit 300 includes a controller 350 for read, set, reset, and defect cell detection and replacement modes. The controller 350, implemented in this example using a bias arrangement state machine, controls the application of biasing arrangement supply voltages and current sources 355 to apply bias arrangements including bias arrangements for read, set, reset, and defect cell detection and replacement. The controller 350 is coupled to the sense amplifiers in block 330 via feedback bus 375, and is responsive to output signals from the sense amplifiers of block 330 during the defect cell detection and replacement process. The controller 350 includes memory for storing a counter value used during the defect cell detection process. The controller 350 also stores data based on output signals of the sense amplifiers of block 320 used to indicate the current in a selected memory cell during the defect cell detection process. As described below, the controller 350 includes logic for determining whether the selected memory cell is a defect cell following a first bias arrangement applied to the selected memory cell to establish the higher resistance state, based on whether the difference between first and second currents in the selected memory cell is above a particular value. If the difference between the first and second currents is above the particular value, the controller 350 generates a command signal to the biasing arrangement supply voltages and current sources 355, so that a second bias arrangement is applied to the selected memory cell to establish the higher resistance state. Controller 350 may be implemented using special-purpose logic circuitry as known in the art. In alternative embodiments, controller 350 comprises a general-purpose processor, which may be implemented on the same integrated circuit to execute a computer program to control the operations of the integrated circuit 300. In yet other embodiments, a combination of special-purpose logic circuitry and a general-purpose processor may be utilized for implementation of controller 350.

Figure 4:
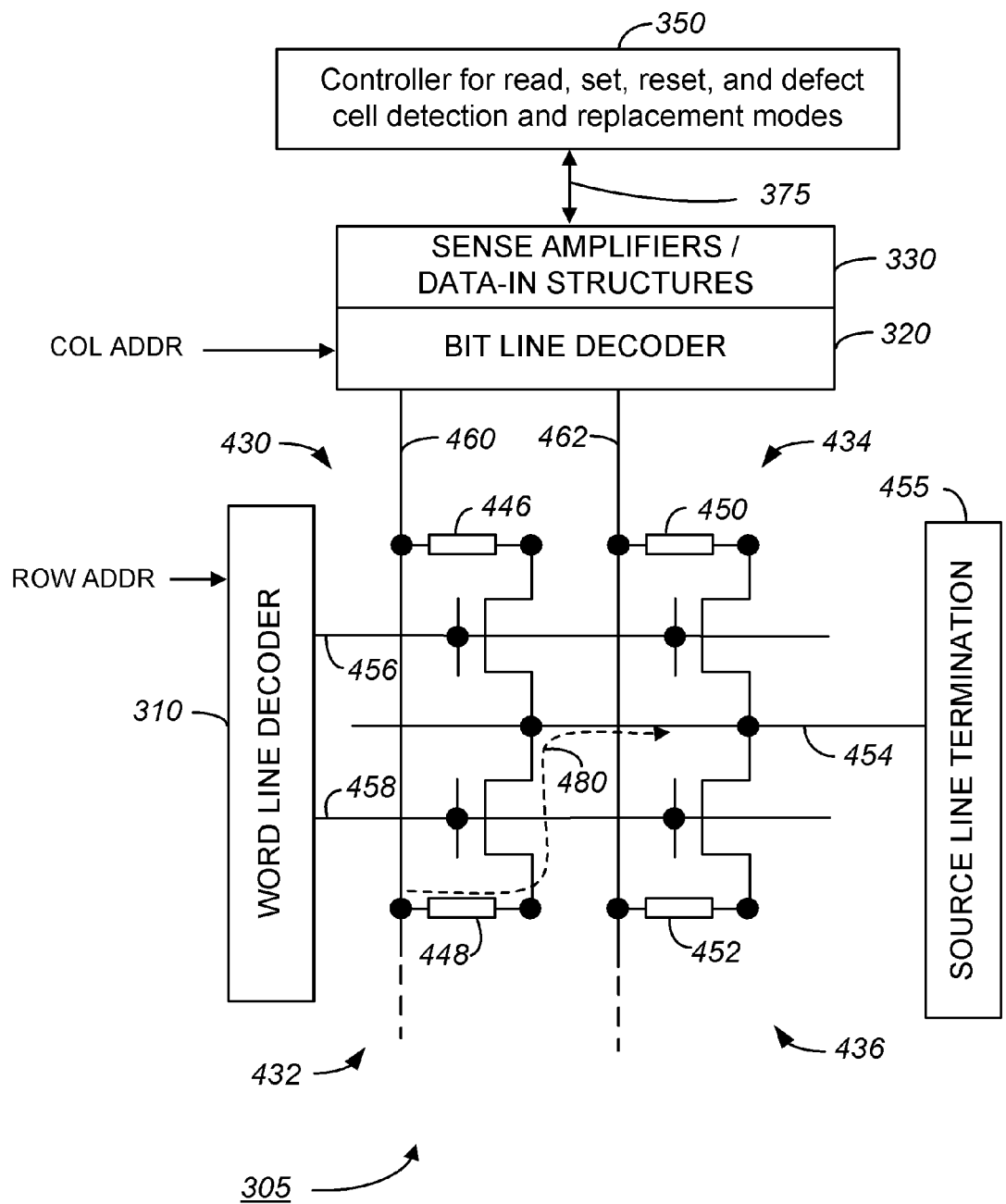
FIG. 4 is a schematic diagram of an embodiment of the array of memory cells of the integrated circuit.

As shown in FIG. 4, each of the memory cells of array 305 includes an access transistor (or other access device such as a diode), four of which are shown as memory cells 430, 432, 434, and 436 having respective phase change memory elements 446, 448, 450, and 452. Four memory cells are illustrated in FIG. 4, representing a small section of the array 305 that can include millions of memory cells. The memory cells are programmable to a plurality of resistance states including a high resistance state and at least one lower programmable resistance state.

Sources of each of the access transistors of memory cells 430, 432, 434, 436 are connected in common to source line 454 that terminates in a source line termination circuit 455, such as a ground terminal. In another embodiment the sources of the access devices are not electrically connected, but independently controllable. The source line termination circuit 455 may include bias circuits such as voltage sources and current sources, and decoding circuits for applying bias arrangements, other than ground, to the source line 454 in some embodiments.

A plurality of word lines 315 including word lines 456, 458 extend in parallel along a first direction. Word lines 456, 458 are in electrical communication with word line decoder 310. The gates of access transistors of memory cells 430, 434 are connected to word line 456, and the gates of access transistors of memory cells 432, 436 are connected to word line 458.

A plurality of bit lines 325 including bit lines 460, 462 extend in parallel in a second direction and are in electrical communication with bit line decoder 320. Memory elements 446, 448 couple the bit line 460 to the respective drains of the access transistors of memory cells 430, 432. Memory elements 450, 452 couple the bit line 462 to the respective drains of the access transistors of memory cells 446, 448.

The memory array 305 is not limited to the array configuration illustrated in FIG. 4, and additional array configurations can also be used. Additionally, instead of MOS transistors, bipolar transistors or diodes may be used as access devices in some embodiments.

In operation each of the memory cells 430, 432, 434, 436 store a data value depending upon the resistance of the corresponding memory elements. The data value may be determined, for example, by comparison of current on a bit line for a selected memory cell to that of a suitable reference current. In a memory cell having three or more states, a plurality of reference currents can be established so that differing ranges of bit line current correspond to each of the three or more states.

Reading or writing to a memory cell of array 305, therefore, is achieved by applying a suitable voltage to one of the word lines, and coupling one of the bit lines to a voltage so that current flows through the selected memory cell including through the corresponding memory element. For example, a current path 480 through a selected memory cell 432 and corresponding memory element 448 is established by applying voltages to the bit line 460, word line 458, and source line 454 sufficient to turn on the access transistor of the memory cell 432 and induce current in path 480 to flow from the bit line 460 to the source line 454, or vice-versa. The level and duration of the voltages applied is dependent upon the operation performed, e.g. a reading operation or a writing operation.

In a read (or sense) operation of memory cell 432, word line decoder 310 facilitates providing word line 458 with a suitable voltage to turn on the access transistor of the memory cell 432. Bit line decoder 320 facilitates supplying a voltage to bit line 460 of suitable amplitude and duration to induce current to flow that does not result in the memory element 448 undergoing a change in resistive state. The current on the bit line 460 and through the memory element 448 is dependent upon the resistance of, and therefore the data state associated with, the memory element 448 of the memory cell 432. Thus, the data state of the memory cell 432 may be determined for example by comparison of the current on the bit line 460 with a suitable reference current by sense amplifiers of block 330. In multi-bit embodiments a plurality of reference currents may be used.

In a set (or program) operation of memory cell 432, word line decoder 310 facilitates providing word line 458 with a suitable voltage to turn on the access transistor of the memory cell 432. Bit line decoder 320 facilitates supplying a voltage to bit line 460 of suitable amplitude and duration to induce a current to flow through the memory element 448, the current sufficient to cause a transition of at least a portion of the active region from the amorphous phase to the crystalline phase, this transition lowering the resistance of the memory element 448 and setting the memory cell 432 to the desired state.

In a reset (or erase) operation of memory cell 432, word line decoder 310 facilitates providing word line 458 with a suitable voltage to turn on the access transistor of the memory cell 432. Bit line decoder 320 facilitates supplying a voltage to bit line 460 of suitable amplitude and duration to induce a current to flow through the memory element 448, the current sufficient to raise the temperature of the active region of the memory element 448 above the transition temperature of the phase change material and also above the melting temperature to place the active region in a liquid state. The current is then terminated, for example, by terminating the voltages on the word line 458 and bit line 460, resulting in a relatively quick quenching time as the active region cools to a high resistance generally amorphous phase in the active region to establish the high resistance reset state in the memory cell 432. The reset operation can also include more than one pulse applied to the bit line 460, for example by using a pair of pulses.

Figure 5:
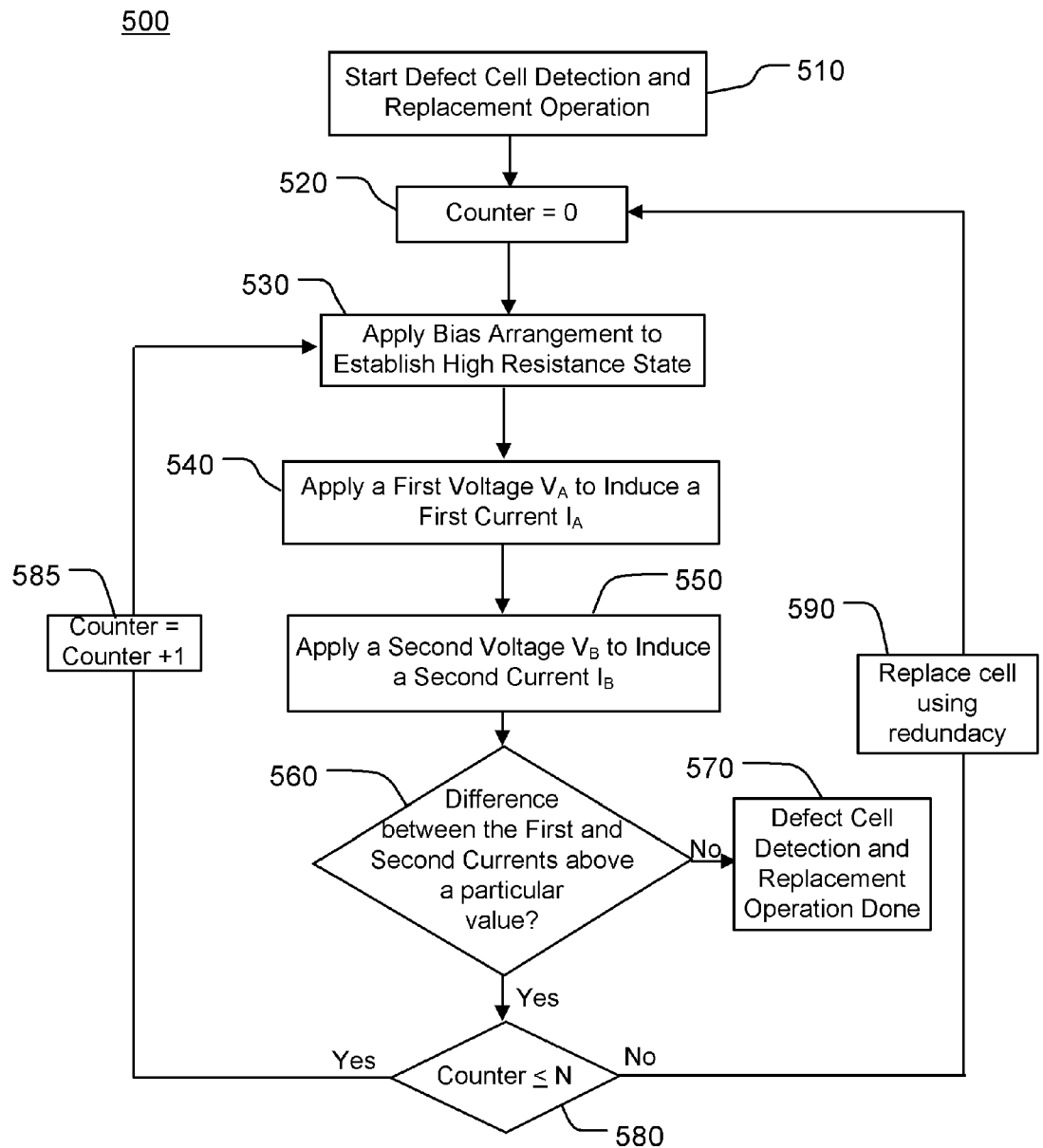
FIG. 5 is a flow diagram of a defect cell detection and replacement operation.

FIG. 5 is a flow diagram of a defect cell detection and replacement operation 500 of memory cell 432 which can be executed by the controller 350.

The operation 500 begins at step 510. At step 520, a counter value stored in the controller 250 is set to zero. As discussed below, the counter value indicates the number of times step 530 has been carried out. The counter value may alternatively be stored in other memory within the integrated circuit 300.

Next, at step 530 a high current bias arrangement is applied to the memory cell 432 to establish the high resistance state. Word line decoder 310 facilitates providing word line 458 with a suitable voltage to turn on the access transistor of the memory cell 432. Bit line decoder 320 facilitates supplying one or more pulses to the bit line 460 of suitable amplitude and duration to induce a current to flow through the memory element 448, thereby raising the temperature of at least the active region above the transition temperature of the phase change material of the memory element 448, and also above the melting temperature to place at least the active region in a liquid state. The current is then terminated, for example by terminating the pulse on the bit line 460 and the voltage on the word line 458, resulting in a relatively quick quenching time as the active region rapidly cools to stabilize to an amorphous phase. The first time step 530 is carried out, the high current bias arrangement may for example be the same as the bias arrangement used during the reset operation of the memory cell 432. More generally, the bias arrangement can include one or more pulses applied to the bit line 460 and/or word line 458 and/or source line 454. The number of pulses and the pulse shapes, including the voltage levels and pulse widths, can be determined empirically for each embodiment.

Next, at step 540 a first bias arrangement is applied to the memory cell 432 to induce a first current in the memory cell 432. The first bias arrangement comprises applying appropriate voltages to the bit line 460, word line 458, and source line 454 to establish a first voltage across the memory element 448. The first voltage induces a first current along path 480 that does not result in the memory element 448 undergoing a change in resistive state. The magnitude of the first current can be determined for example by comparison of the current on the bit line 460 with a suitable reference current by sense amplifiers of sense circuitry 330. The controller 350 stores a first data value based on an output signal of the sense amplifiers of block 330 provided on bus 375, which indicates the magnitude of the first current in the memory cell 432.

Next, at step 550 a second bias arrangement is applied to the memory cell 432 to induce a second current in the memory cell 432. The second bias arrangement comprises applying appropriate voltages to the bit line 460, word line 458, and source line 454 to establish a second voltage across the memory element 448. The second voltage is different from the first voltage of step 540, and induces a second current along path 480 that does not result in the memory element 448 undergoing a change in resistive state. The magnitude of the second current can be determined by comparison of the current on the bit line 460 with a suitable reference current by sense amplifiers of sense circuitry 330. The controller 350 stores a second data value based on an output signal of the sense amplifiers of block 330 provided on bus 375, which indicates the magnitude of the second current in the memory cell 432.

Figure 6:
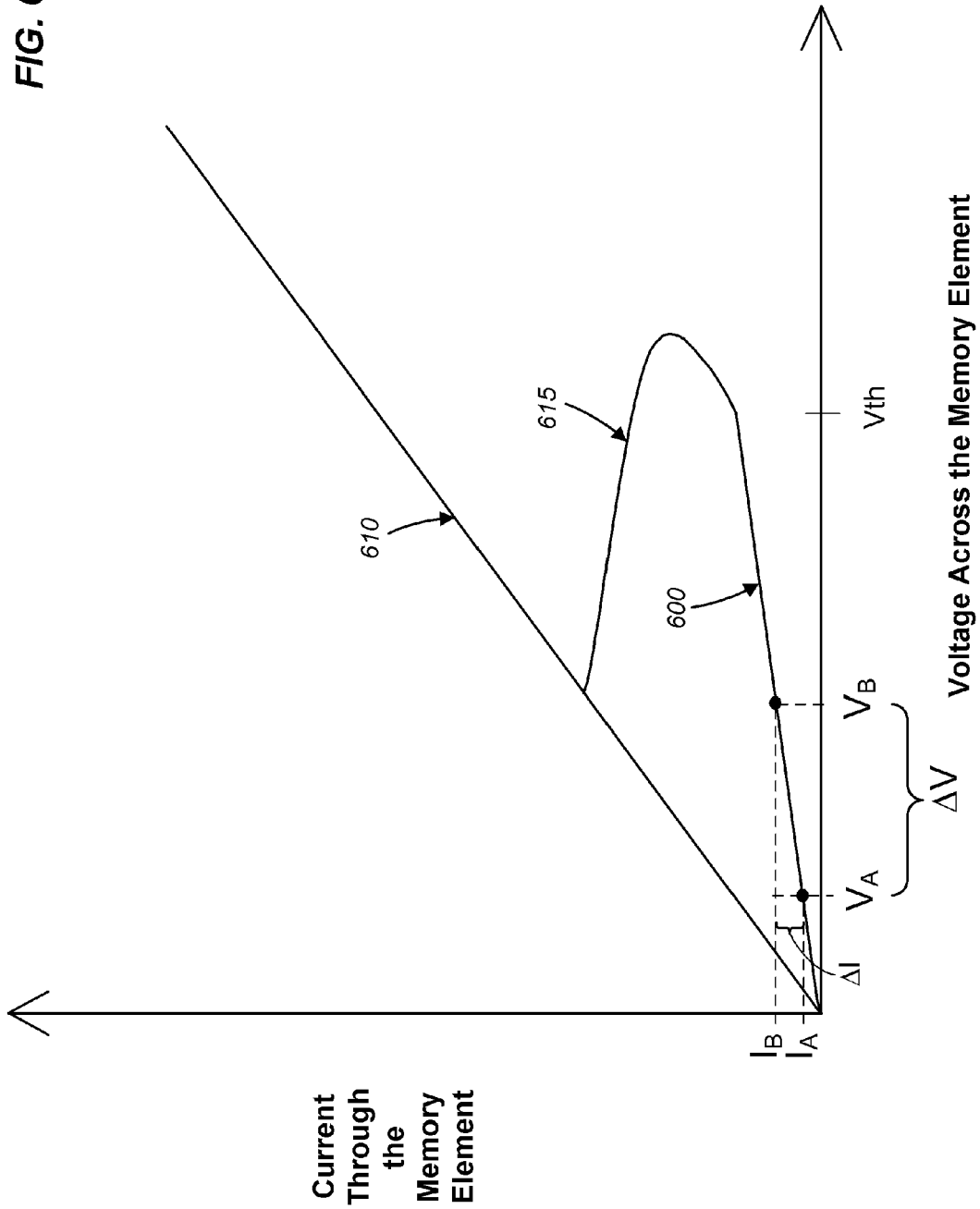
FIG. 6 illustrates an example of the current-voltage (IV) behavior of a representative memory cell.

FIG. 6 illustrates an example of the current-voltage (IV) behavior of the phase change memory element 448 of the memory cell 432. In FIG. 6 curve 600 represents the IV behavior of the memory cell 432 when in the high resistance state and curve 610 represents the IV behavior of the memory cell in the low resistance state. FIG. 6 also includes curve 615 representing the transition from the high resistance state to the low resistance state. The curve 615 is merely illustrative, and the actual shape of the curve 615 depends upon the properties of the memory cell 432, the manner in which the voltages are applied to the memory cell 432, and the manner in which the phase change material heats up and cools down.

The threshold voltage $V_{TH}$ is a voltage level across the memory element 448 above which a transition from the high resistance state to the lower resistance state begins. Because the memory cell 432 undergoes a phase change as a result of heating of the phase change memory element 448, the threshold voltage $V_{TH}$ is dependent upon the implementation of the memory cell 432 including the memory cell structure, the thermal and electrical properties of the materials of the memory cell 432, and the pulse shape of the applied energy. The threshold voltage $V_{TH}$ can be determined empirically for each embodiment.

As shown in FIG. 6, the first voltage $V_A$ applied across the memory element 448 at step 530 induces the first current $I_A$. The second voltage $V_B$ applied across the memory element 448 at step 550 induces the second current $I_B$. In the illustrated example the first voltage $V_A$ is less than the second voltage $V_B$. Alternatively, the first voltage $V_A$ can be greater than the second voltage $V_B$.

The first and second voltages $V_A$ and $V_B$ are less than threshold voltage $V_{TH}$, so that the memory element 448 does not undergo a change in resistive state. Thus, a given voltage difference $\Delta V = V_B - V_A$ applied across the memory element 448 results in a current difference $\Delta I = I_B - I_A$ through the memory element 448. As discussed in more detail below, the current difference $\Delta I = I_B - I_A$ is used to determine whether the memory cell 432 is a defect cell.

Referring back to FIG. 5, at step 560, the controller 350 determines whether the difference between the first and currents is above a particular value. As discussed below with respect to FIGS. 14A-14C, the particular value can be determined empirically and indicates that the memory cell may be a defect cell.

The comparison of the difference between the first and second currents and the particular value used at step 560 can be carried out in a wide variety of ways, depending upon how the difference is expressed. For example, the difference may be expressed as the absolute value of the current difference $\Delta I$. As another example, the difference may be based on a change in current between the first and second currents, such as a percentage change. As another example the difference may be based on a ratio of the current difference $\Delta I$ to the voltage difference $\Delta V$. This ratio may for example be the slope of the IV curve of the memory cell 432, expressed as ΔI/ΔV. The ratio may alternatively be the slope of the I√V, expressed as ΔI/Δ√V. Other techniques for expressing the difference between the first and second currents and the particular value may alternatively be used.

More generally, determining whether the memory cell is a defect cell can be based on the first and second currents in a wide variety of ways, such as the sum of the first and second currents.

At step 560, if the difference between the first and second currents is not above the particular value, the memory cell 432 is not a defect cell and the operation ends at step 570.

If the difference between the first and second currents is above the particular value, the memory cell 432 is a defect cell and the operation continues to step 580. At step 580 is it determined whether the counter value indicating the number of times step 530 has been carried out is above a particular number of retries N. N may be for example, an integer between 2 and 10. In one embodiment N is equal to 2.

If the counter value is less than the particular number of retries N, the counter value is incremented at step 585. The operation 500 then continues back to block 530 where the controller 350 generates a command signal to the biasing arrangement supply voltages and current sources 355, so that a subsequent high current bias arrangement is applied to the memory cell 432 to establish the high resistance state. The subsequent high current operation is adapted to increase the amount of amorphous phase material within the active region of the memory cell 432 compared to that of the initial high current operation applied at the first instance of block 530. The subsequent high current bias arrangement can have for example a different pulse height, pulse width, and/or pulse tail, than that of the initial high current operation applied at block 530. For example, the subsequent high current bias arrangement can be adapted to increase the magnitude of the current through the memory cell 432 compared to the initial high current bias arrangement by at least 10%, such as by at least 50%, in some embodiments by at least 100%.

As a result, if the memory cell 432 is a defect cell following the initial high current operation, it may be properly reset to have a sufficient amount of amorphous phase material by the additional high current operation. Thus, the operation 500 can overcome the data retention issues caused by having a small amount of amorphous phase material, thereby extending the useful life of the memory cell 432. In addition, since the additional high current operation is applied only if the memory cell 432 is a defect cell, issues due to over-resetting are avoided.

The operation 500 continues in the loop of steps 530, 540 and 550 until the difference between the first and second currents is no longer above the particular value (step 560), or the counter value is greater than the particular number of retries N. If the counter value is greater than N, the memory cell 432 cannot be properly reset and is replaced using redundancy at step 590. The redundancy of step 590 can be carried out, for example, by storing the bit line address of the defective memory cell 432 in nonvolatile memory on the integrated circuit 300, which is used by the address circuitry (See, reference number 352, FIG. 3) to reroute addresses of defective memory cells into addresses of replacement cells. Other techniques for redundancy may alternatively be used.

The defect cell detection and replacement operation 500 may be carried out in the manufacturing line using test equipment, so that memory cells which are defective due to manufacturing defects are identified and replaced. The operation 500 is also carried out from time to time over the lifetime of the device, so that defect cells which arise during the operation of the device can be identified and replaced. For example the operation 500 can be carried out as part of the normal reset operation of the memory cells in the array 305. In yet other embodiments, the operation 500 is performed after a given number of set and/or reset operations have been performed on the selected memory cell. For example, the operation 500 can be performed once for every one hundred reset operations performed on the selected memory cell.

Following the operation 500, data indicating the particular high current bias arrangement used to successfully reset the memory cell 432 can be stored in nonvolatile memory in the integrated circuit 300. This data is then used by the controller so that this particular high current bias arrangement is used during subsequent reset operations of the memory cell 432, which ensures that the memory cell 432 will be properly reset. In addition, this particular high current bias arrangement can be used as the initial high current bias arrangement during subsequent application of the defect cell detection and replacement operation 500 of the memory cell 432.

Figure 7:
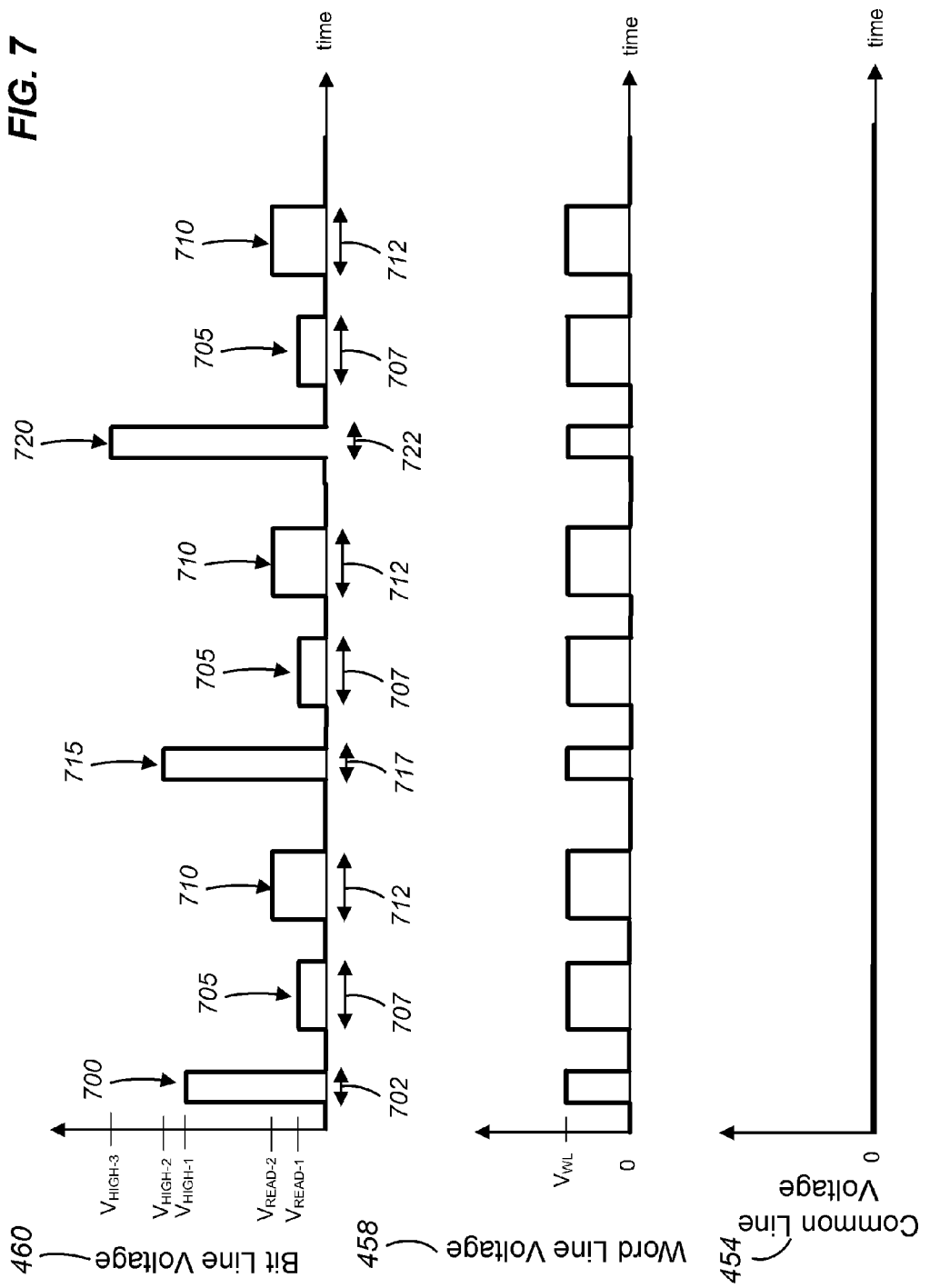
FIG. 7 illustrates an example of a timing diagram of the defect cell detection and replacement operation of FIG. 5.

FIG. 7 illustrates an example of a timing diagram of the defect cell detection and replacement operation 500 of FIG. 5. As will be understood the timing diagram of FIG. 7 is simplified and not necessarily to scale.

In the illustrated example of FIG. 7, the high current bias arrangement of the first instance of step 530 comprises applying a voltage $V_{WL}$ to word line 458 to turn on the access transistor of the memory cell 432, and applying a voltage pulse 700 having a pulse height $V_{HIGH-1}$ and pulse width 702 to the bit line 460 to induce current to flow in path 480 to establish the high resistance state in the memory element 448.

Next, at step 540 the first bias arrangement is applied to the memory cell 432 to induce the first current in the memory cell 432. In FIG. 7, the first bias arrangement comprises applying a voltage $V_{WL}$ to word line 458 to turn on the access transistor of the memory cell 432, and applying a voltage pulse 707 having a pulse height $V_{READ-1}$ and pulse width 707 to induce the first current to flow in path 480.

Next, at step 550 the second bias arrangement is applied to the memory cell 432 to induce the second current in the memory cell 432. In FIG. 7, the second bias arrangement comprises applying a voltage $V_{WL}$ to word line 458 to turn on the access transistor of the memory cell 432, and applying a voltage pulse 710 having a pulse height $V_{READ-2}$ and pulse width 712 to induce the second current to flow in path 480.

In the illustrated example of FIG. 7, the difference between the first and second currents following the voltage pulse 700 in the first instance of step 530 is above the particular value. Thus, the memory cell 432 is a defect cell which has not been properly reset, and the process continues to a second instance of step 530. The high current bias arrangement of the second instance of step 530 comprises applying a voltage $V_{WL}$ to word line 458 to turn on the access transistor of the memory cell 432, and applying a voltage pulse 715 having a pulse height $V_{HIGH-2}$ and pulse width 717 to the bit line 460 to induce current to flow in path 480 to establish the high resistance state in the memory element 448. As shown in FIG. 7, the pulse height $V_{HIGH-2}$ is greater than the pulse height $V_{HIGH-1}$.

Next, the first and second bias arrangements are applied to induce the first and second currents to flow in path 480. In the illustrated example of FIG. 7, the difference between the first and second currents following the voltage pulse 715 is above the particular value. Thus, the memory cell 432 remains a defect cell which has not been properly reset, and the process continues to a third instance of step 530. The high current bias arrangement of the third instance of step 530 comprises applying a voltage $V_{WL}$ to word line 458 to turn on the access transistor of the memory cell 432, and applying a voltage pulse 720 having a pulse height $V_{HIGH-3}$ and pulse width 722 to the bit line 460 to induce current to flow in path 480 to establish the high resistance state in the memory element. As shown in FIG. 7, the pulse height $V_{HIGH-3}$ is greater than $V_{HIGH-2}$.

Next, the first and second bias arrangements are applied to induce the first and second currents to flow in path 480. In the illustrated example of FIG. 7, the difference between the first and second currents following the voltage pulse 720 is below the particular value. Thus, the memory cell 432 has been properly reset, and the operation 500 ends.

In the illustrated example of FIG. 7, each instance of step 530 comprises a single pulse applied to the bit line 460, and the source line 454 remains grounded.

More generally, a set of one or more pulses may be applied to the bit line 460 and/or source line 454 to induce current to flow in path 480 to establish the high resistance state in the memory element 448. The number of pulses and the pulse shapes, including the voltage levels and pulse widths can be determined empirically.

Figure 8:
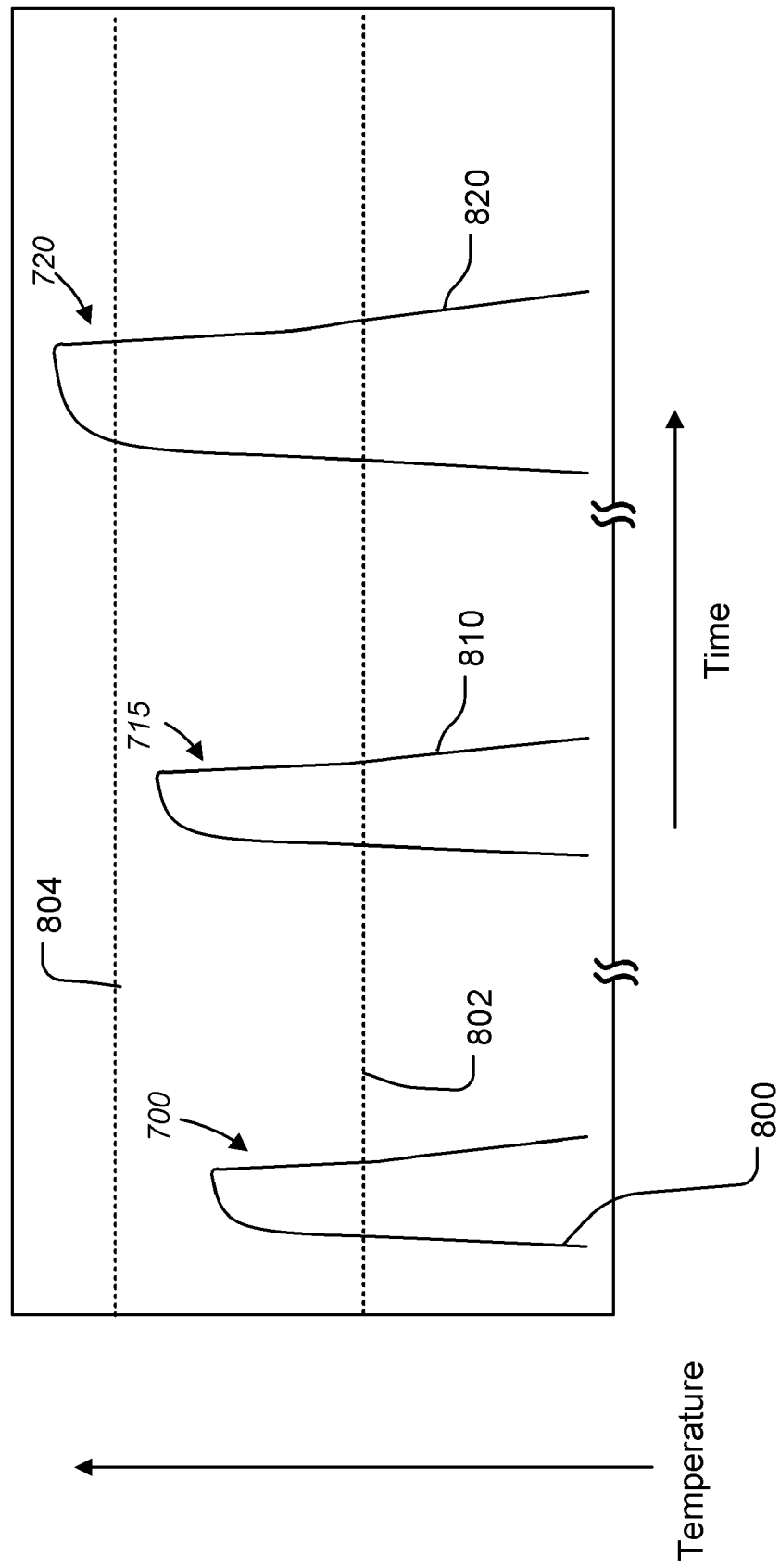
FIG. 8 illustrates heuristic plots of the temperature versus time of the memory element of a selected memory cell during the timing diagram of FIG. 7.

FIG. 8 illustrates example heuristic plots of the temperature versus time of the memory element 448 of the memory cell 432 for the timing diagram of FIG. 7.

As represented heuristically by curve 800 of FIG. 8, the voltage pulse 700 of the first instance of step 530 causes current through the memory element 448 sufficient to raise the temperature of at least an active region of the memory element 448 above the transition temperature (crystallization) temperature 802 of the phase change material. However, the voltage pulse 700 is insufficient to raise the temperature of at least the active region above the melting temperature 804. Thus, the voltage pulse 700 is insufficient to properly reset the memory element 448, and the amount of amorphous phase material within the active region is small. Similarly, as represented heuristically by curve 810 of FIG. 8, the voltage pulse 715 is insufficient to reset the memory element 448, as the voltage pulse 715 is also insufficient to raise the temperature of at least the temperature of at least the active region above the melting temperature 804.

As represented heuristically by curve 820 of FIG. 8, the voltage pulse 720 is sufficient to raise the temperature of at least the active region above the melting temperature 804. As a result, the voltage pulse 720 establishes a sufficient amount of amorphous phase material within the active region, so that it properly resets the memory cell 432.

In the illustrated example of FIG. 7, the pulse height of the pulses 700, 715, and 720 are increased for each instance of step 530. Alternatively, other characteristics of the pulses for each instance of step 530 may be changed. In one alternative embodiment the pulse heights of the pulses 700, 715, and 720 are the same, and the pulse tail is shortened for each instance of step 530.

In FIG. 7 the same word line voltage $V_{WL}$ is applied at each of the various steps 530, 540 and 550. In alternative embodiments the word line voltage applied during step 530 may be higher than that applied during the steps 540 and 550 in some embodiments. In advanced nodes, such as for example the 90 nm node, a higher word line voltage can be used to overdrive the MOSFET access transistor and obtain a higher programming current.

In FIG. 7, the voltage on the bit line 460 was varied at each of the various steps 530, 540 and 550. In alternative embodiments the voltage on the word line 458 may be varied instead of, or in addition to, the voltage on the bit line 460.

Figure 9:
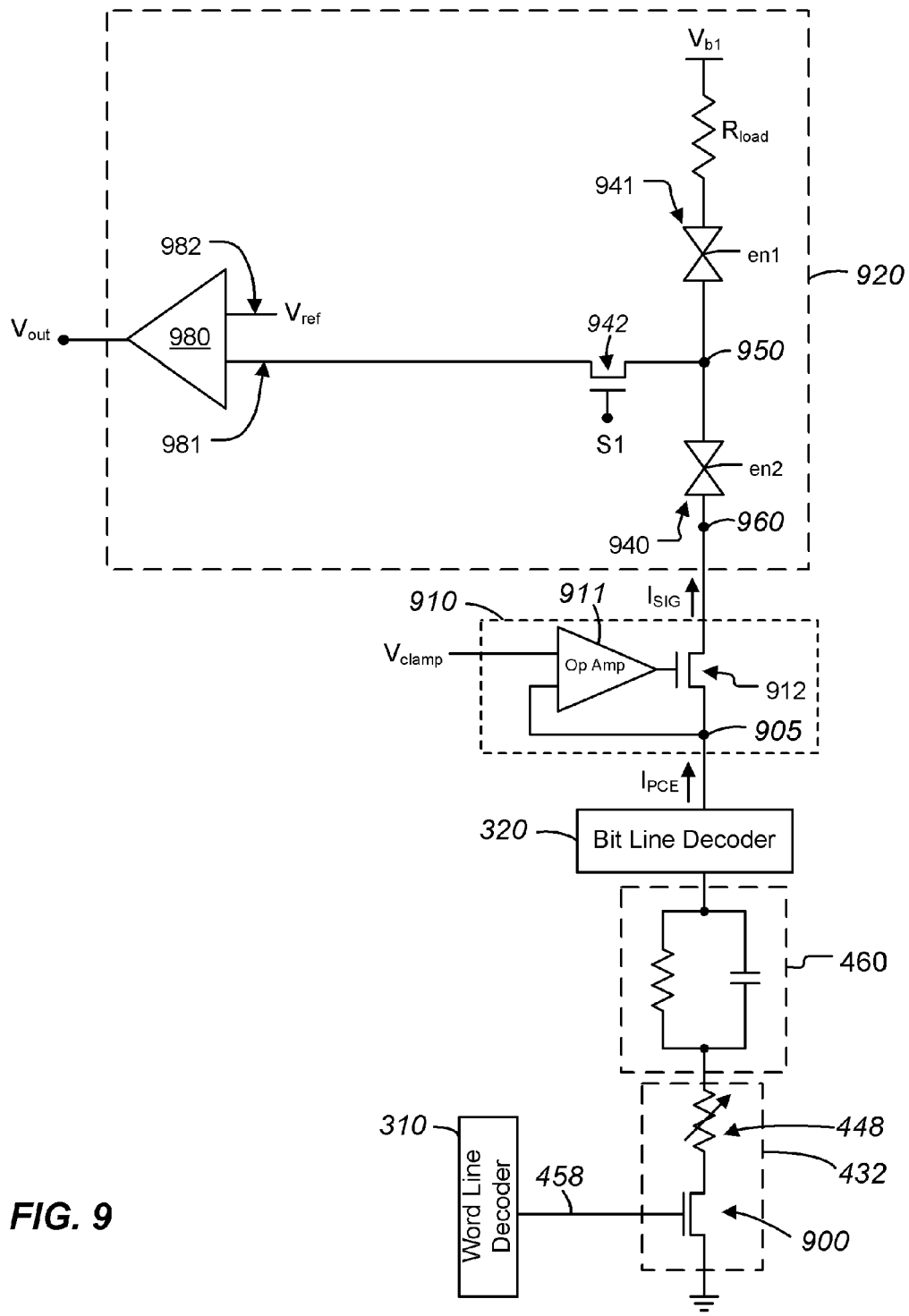
FIG. 9 is a schematic diagram of an embodiment of sense circuitry architecture which can be used during the defect cell detection and replacement operation.

FIG. 9 is a simplified diagram of an embodiment of sense circuitry architecture of block 330 which can be used during the steps 540 and 550 of applying the first and second voltages and sensing the first and second currents in the selected memory cell 432.

In the simplified diagram of FIG. 9, memory cell 432 is modeled by access transistor 900 and a variable resistor for phase change memory element 448. Bit line 460 is modeled by a resistor/capacitor network as shown. The bit line decoder 320 is operable in response to address signals to couple the selected bit line 460 to node 905. The word line decoder 310 is operable in response to address signals to couple the selected word line 458 to a bias voltage (not shown) sufficient to turn on the access transistor 900.

Voltage clamping circuitry 910 is coupled to node 905 to provide a voltage to the selected memory cell 432 to induce a current $I_{PCE}$ in the memory cell 432 during each of the steps 540 and 550. As will be described in more detail below, the voltage at node 981 indicates the current $I_{PCE}$ in the memory cell 432 for a given $V_{CLAMP}$. The sense amplifier 980 flips the state of an output signal $V_{OUT}$ when a time varying $V_{REF}$ is higher than the voltage at node 981.

The current-voltage operational point of step 540 for the memory cell 432 can be determined as follows. A bit line address signal is supplied to the bit line decoder 320 to couple the bit line 460 of the selected memory cell 432 to the node 905, a word line address signal is supplied to the word line 458 sufficient to turn on access transistor 900, and voltage clamping circuitry 910 is responsive to a first clamping voltage $V_{CLAMP1}$ to provide a first voltage $V_A$ to node 905. The first voltage $V_A$ induces the first current $I_A$ through the memory cell 432.

Enable signal $en_2$ turns on transmission gate 940 to couple node 960 to sensing node 950, enable signal $en_1$ turns on transmission gate 941 to couple the series arrangement of a bias voltage $V_{b1}$ and resistive load element $R_{load}$ to the sensing node 950, resulting in a current $I_{SIG}$ provided by the voltage clamping circuitry 910 to the sense amplifier circuitry 920. In the illustrated embodiment $R_{load}$ is shown as a resistor, although in some embodiments an active load such as a diode connected transistor can be alternatively used.

The magnitude of the current $I_{SIG}$ provided by the voltage clamping circuitry 910 is dependent upon the magnitude of the current $I_{PCE}$. In the illustrated embodiment the voltage clamping circuitry 910 includes operational amplifier 911 and pass transistor 912 such that the magnitudes of $I_{SIG}$ and $I_{PCE}$ are substantially equal. In alternative embodiments the voltage clamping circuitry 910 may be implemented such that the magnitude of $I_{SIG}$ is a function of $I_{PCE}$, for example being directly or inversely proportional.

The current $I_{SIG}$ sets a voltage on the sensing node 950, and signal S1 is set to a high state to turn on pass transistor 942 and couple node 981 of the sense amplifier 980 to the sensing node 950. The sense amplifier 980 is responsive to the difference between the voltage on the first input 981 and a predetermined time varying reference voltage $V_{REF}$ on a second input 982 to change the state of the output signal VOUT when $V_{REF}$ is higher than the voltage at the first input 981. $V_{REF}$ will vary from embodiment to embodiment, and in one example is varied from 0 Volts to 3 Volts in 100 staircases.

Since the voltage on the sensing node 950 depends upon the current $I_{PCE}$ through the memory cell 432, the time at which $V_{OUT}$ changes state indicates the current $I_{PCE}$ in the memory cell 432.

The second current-voltage operational point of step 550 for the memory cell 432 can then be determined using second voltage $V_B$ in a similar manner.

In some embodiments more than one sense amplifier can be used for the different current ranges. Another technique for reading the current in the memory cell 432 is to compare $I_{CPE}$ at one $V_{CLAMP}$ with many pre-determined current reference values to determine how large $I_{PCE}$ is with respect to $V_{CLAMP}$. Doing this twice for different $V_{CLAMP}$ voltages, the slope of the IV behavior of the memory cell 432 can be determined. This is the technique used to obtain the following measured data.

Figure 10A:
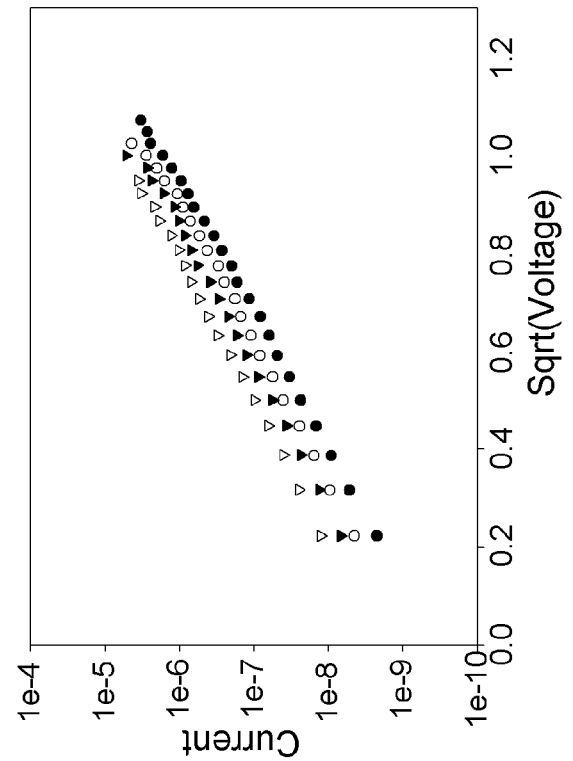
FIGS. 10A and 10B are plots of measured current-voltage behavior of a mushroom-type phase change memory cell at various temperatures.
Figure 10B:
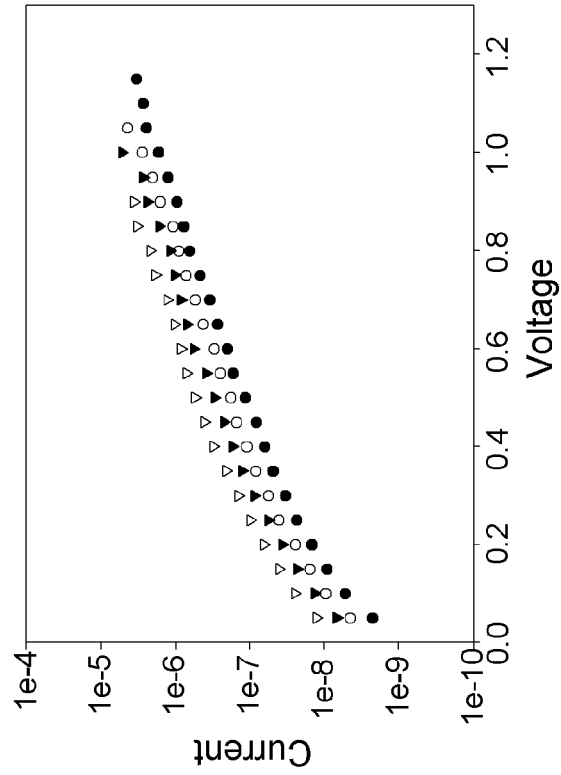

FIGS. 10A and 10B are plots of measured current-voltage behavior of a phase change memory cell at 25, 45, 65, and 85 degrees Celsius. FIG. 10A is a plot of voltage-current behavior, where current is plotted on a log scale. FIG. 10B is a plot of the square root of voltage versus current, where current is plot on a log scale.

Figure 11:
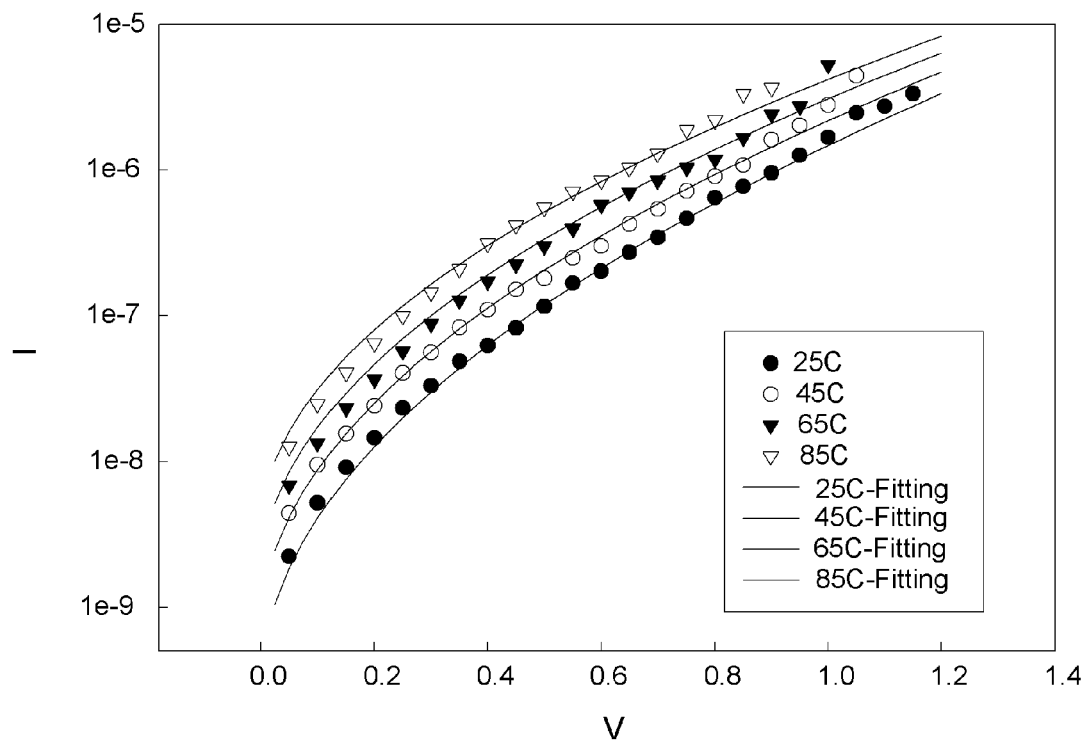
FIG. 11 is a plot showing the fitting of measured current-voltage behavior to the equation illustrated in the figure.
Figure 12A:
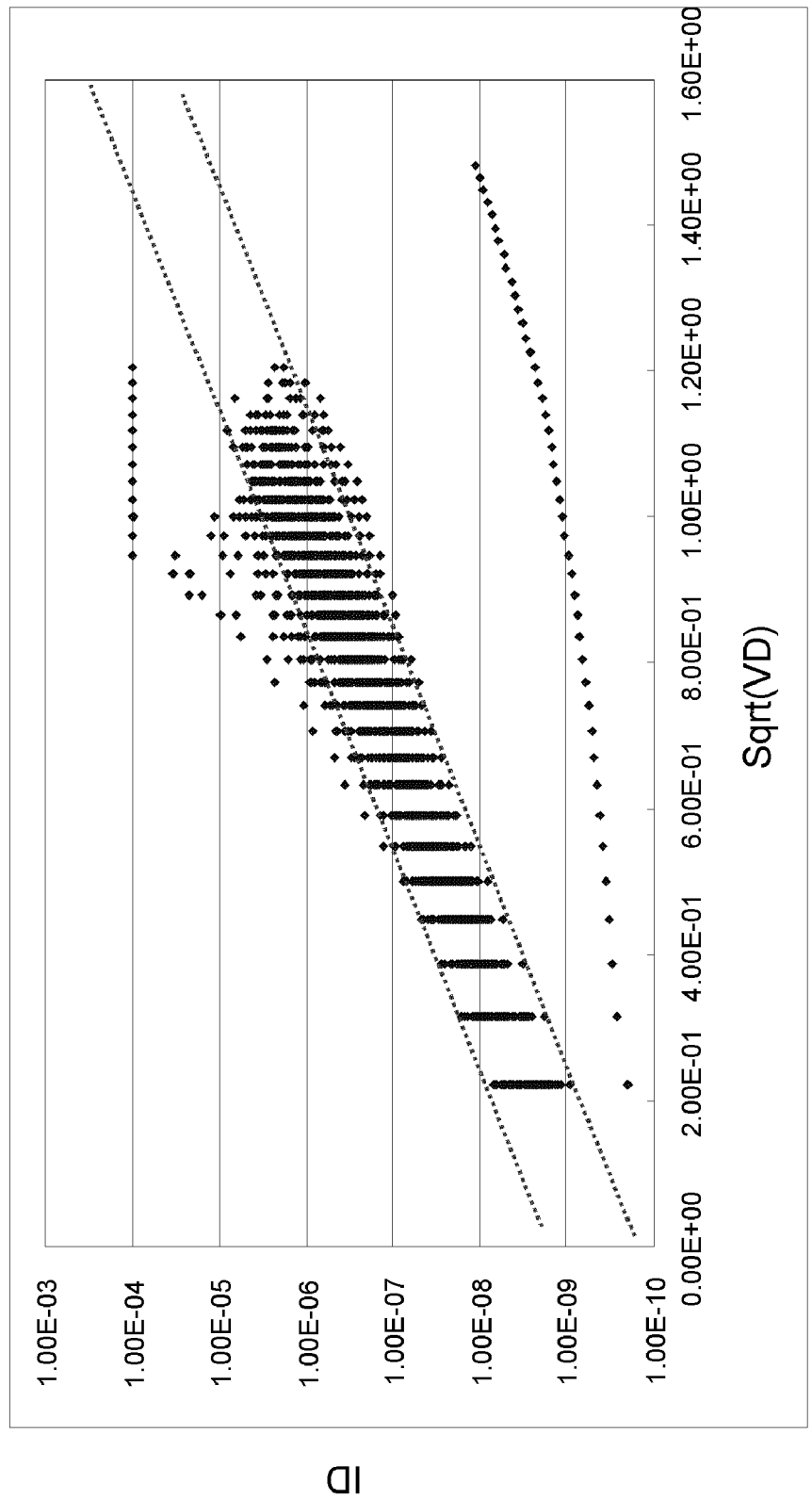
FIGS. 12A-12D are plots of measured data of the current-voltage behavior of phase change memory cells at various temperatures.
Figure 12B:
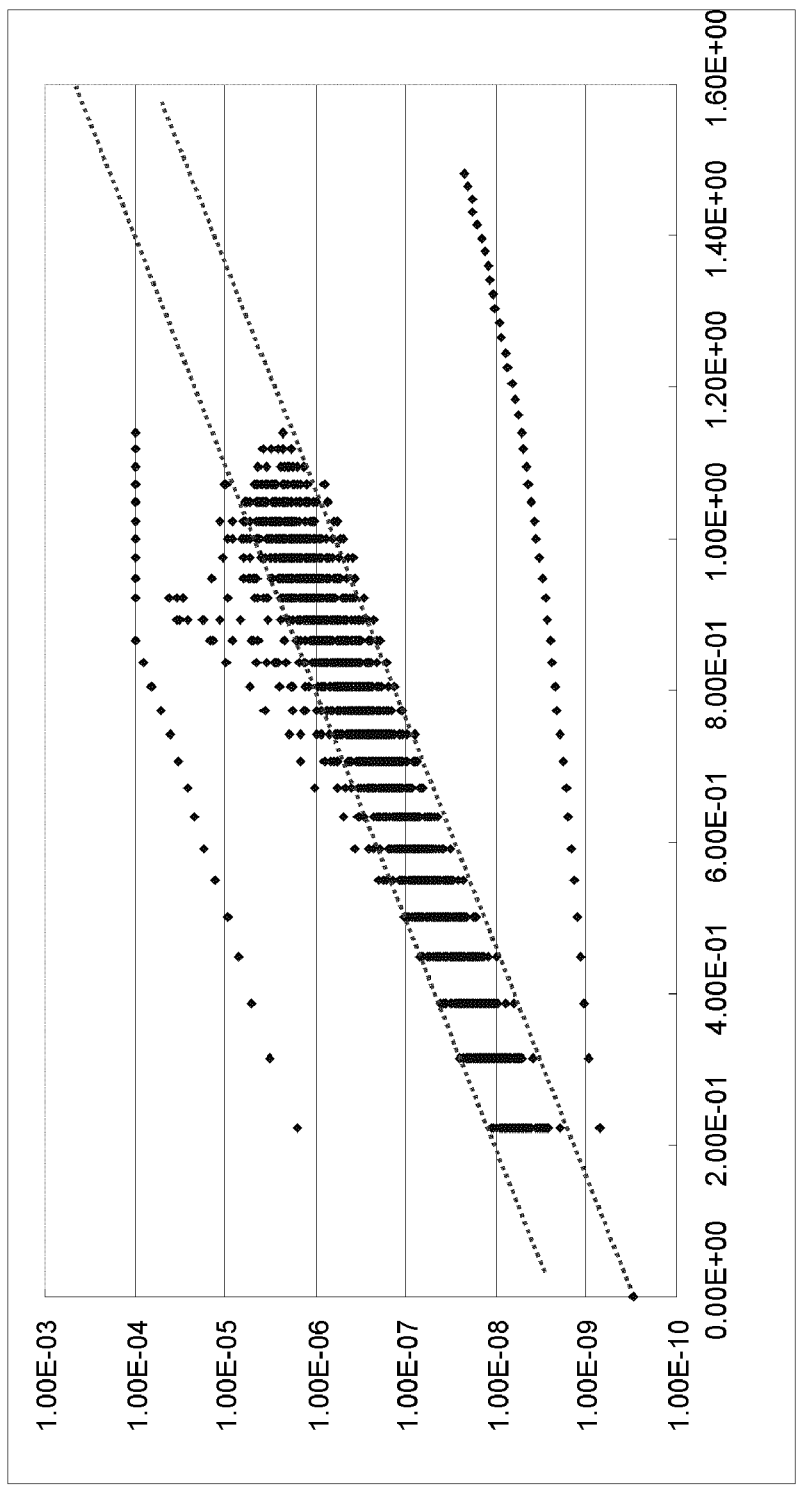
Figure 12C:
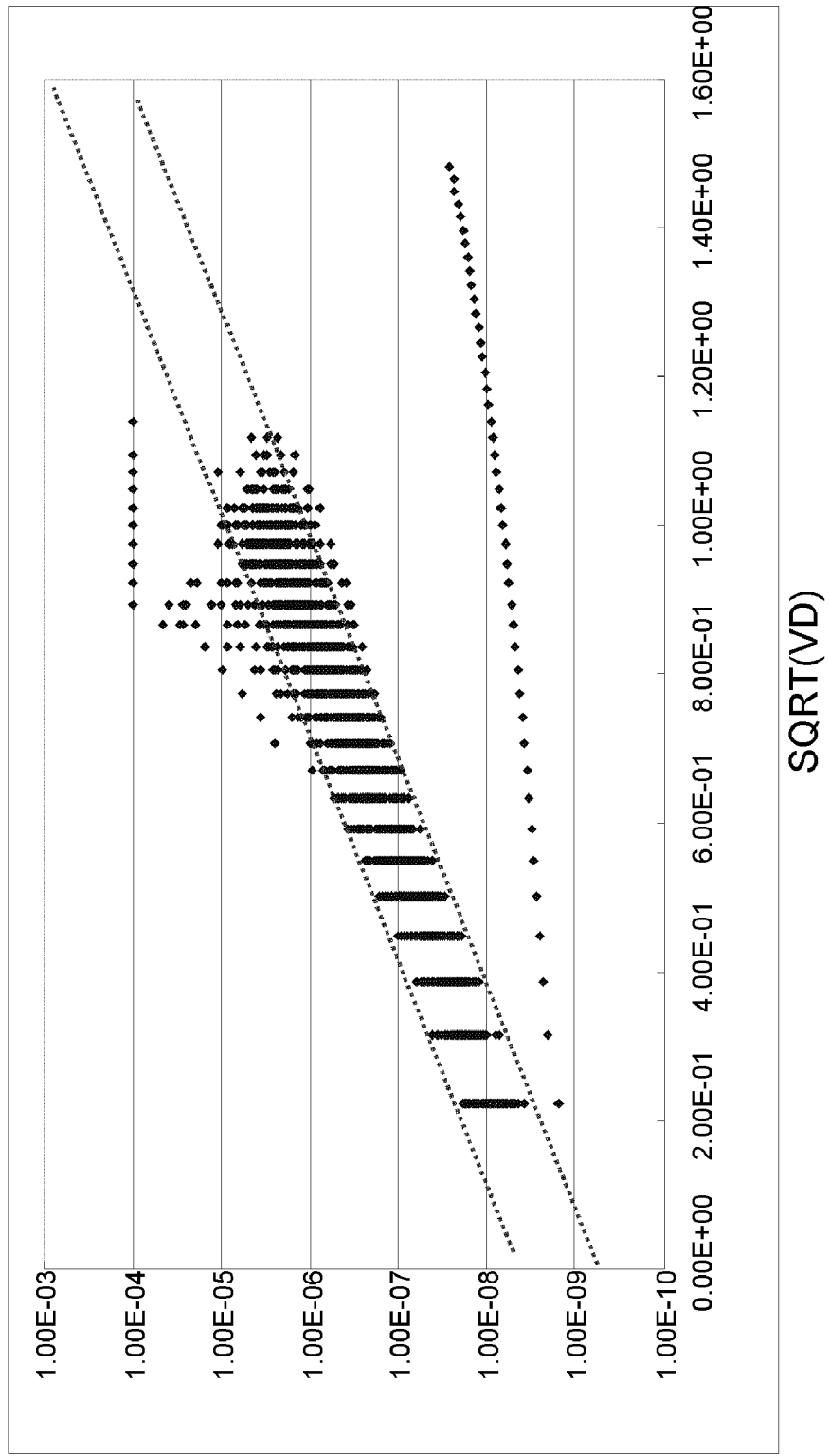
Figure 12D:
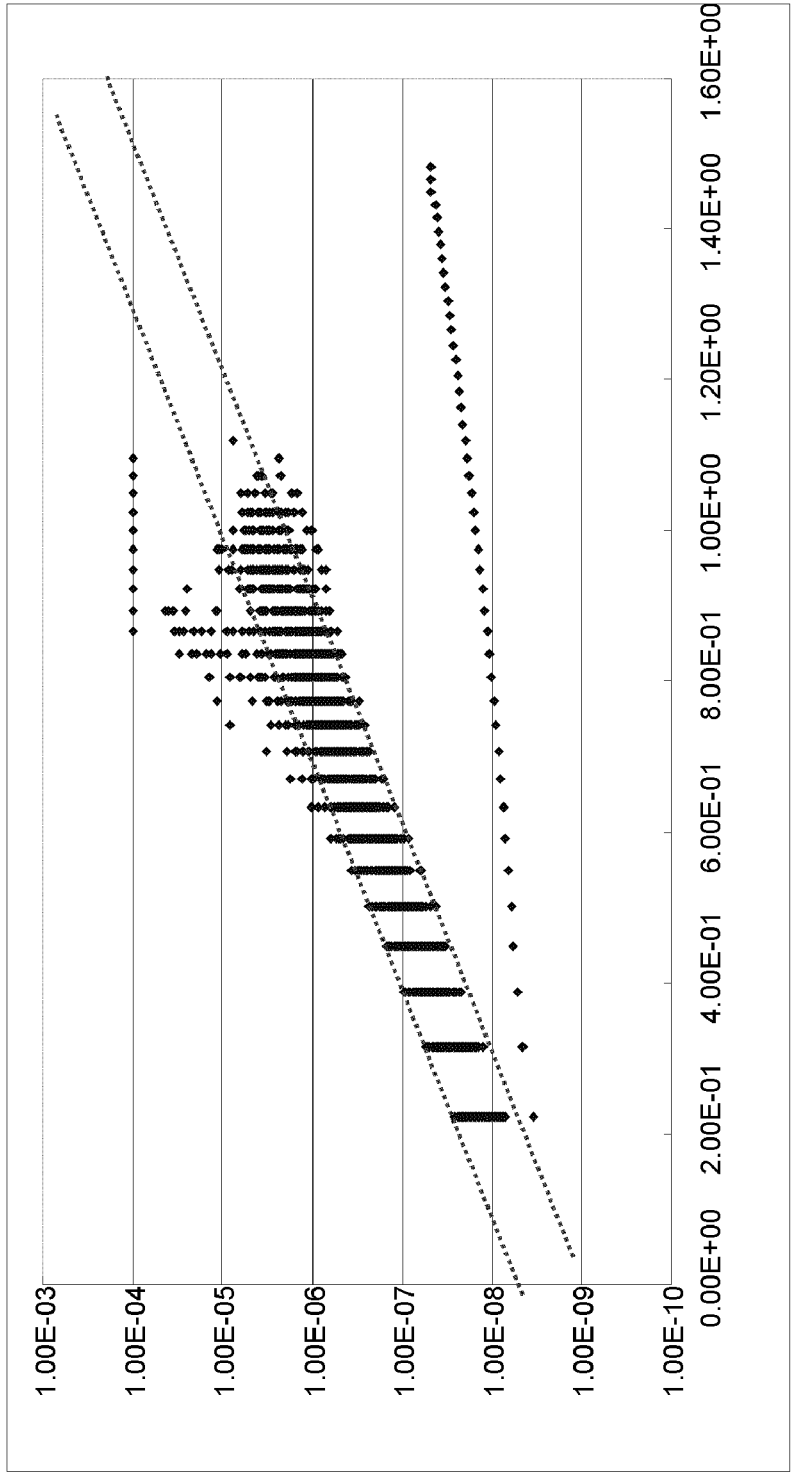

FIG. 11 is a plot showing the fitting of measured current-voltage characteristics to the equation illustrated in the figure. As can be seen, the current-voltage characteristics can be accurately modeled using this equation.

FIGS. 12A-12D are plots of measured data of current-voltage behavior of 100 phase change memory cells at 25, 45, 65, and 85 degrees Celsius respectively. In FIGS. 12A-12D, the defect cells are shown to have a current-voltage behavior which extends outside the dashed lines which encompass the current-voltage behavior of properly reset memory cells. This is explained in more detail below with respect to FIGS. 13A and 13B.

Figure 13A:
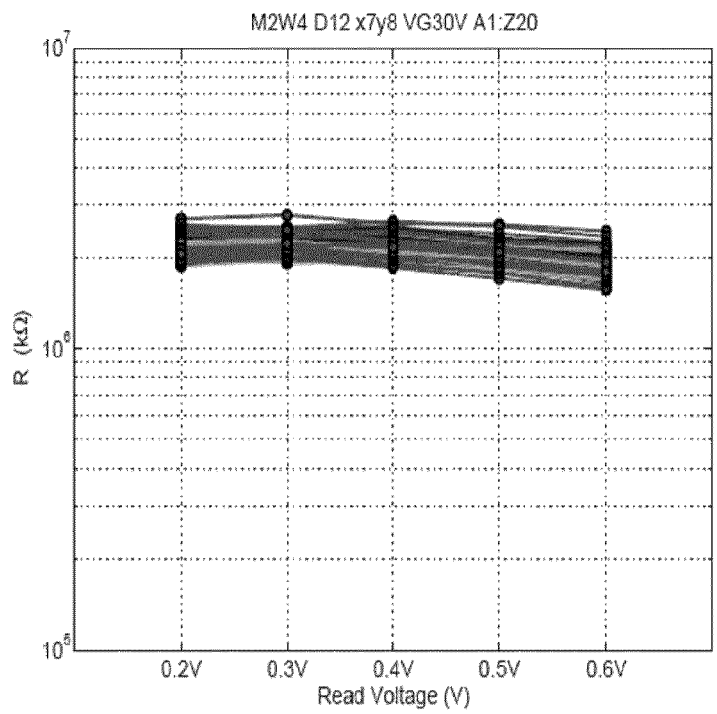
FIGS. 13A-13B are plots of the measured resistance of a number of memory cells versus voltage.

FIG. 13A is a plot of the measured resistance of a number of mushroom-type phase change memory cells in the high resistance state versus voltage. The data in FIG. 13A was measured following a reset voltage pulse having a pulse height of 3.0 Volts and a pulse width of 50 ns applied across each of the memory elements. The 3.0 Volt reset pulse is adapted to induce a relatively high reset current in the memory cells, so that the memory cells have a large amount of amorphous phase material and thus are adequately reset to the high resistance state. That is, none of the memory cells for which data is shown in FIG. 13A are defect cells following the 3.0 Volt reset pulse.

As can be seen in FIG. 13A, the measured resistance of the memory cells remains relatively constant versus applied voltage. Since resistance is the ratio of the voltage to current, the data in FIG. 13A indicates the current-voltage behavior for memory cells which are not defect cells.

Figure 13B:
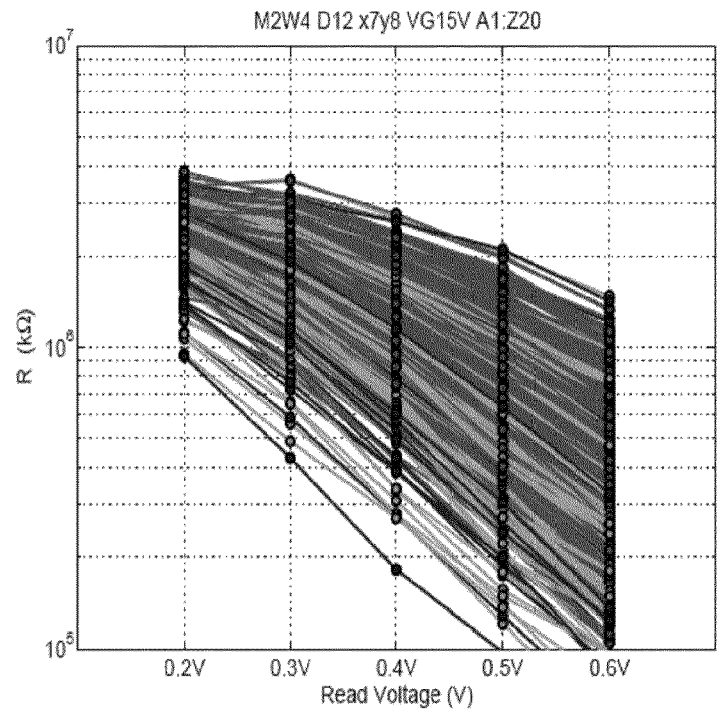

FIG. 13B is a plot of the measured resistance versus voltage for the same memory cells measured to obtain the data of FIG. 13A. The memory cells were first set to the low resistance state, and the data in FIG. 13B was measured following a reset pulse having a pulse height of 1.5 Volts and a pulse width of 50 ns applied across each of the memory elements. The 1.5 V reset pulse is adapted to induce a relatively small current in the memory cells, so that the memory cells have a relatively small amount of amorphous phase material compared to the use of the 3.0 Volt reset pulse, such as would occur in a memory cell having large bottom electrode as discussed above in connection with FIG. 2B. That is, because of the smaller pulse height, the current induced by the 1.5 Volt reset pulse is smaller than the current induced by the 3.0 Volt reset pulse. This small current is not sufficient to cause a transition of a sufficient amount of crystalline phase material into the amorphous phase, resulting in a small amount of amorphous phase material in the active regions of the memory cells. The small amount of amorphous phase material results in data retention issues and bit errors because of the drift in resistance as small portions of the active regions re-crystallize due to environmental conditions to which the device is exposed. Thus, the data in FIG. 13B indicates the current-voltage behavior of memory cells which are defect cells.

FIGS. 13A and 13B demonstrate that memory cells which are adequately reset to the high resistance state (the data in FIG. 13A) have different current-voltage behavior (e.g. slope) versus voltage than memory cells which are defect cells (the data in FIG. 13B). Accordingly, the data in FIGS. 13A and 13B show that the difference in the IV behavior of the memory cells for different voltages can be used to identify which memory cells are defect cells.

As described above in connection with the flow diagram of FIG. 5, the particular value used to determine whether the selected memory cell is a defect cell can be determined empirically. This is discussed in more detail below in connection with FIGS. 14A-14C.

Figure 14A:
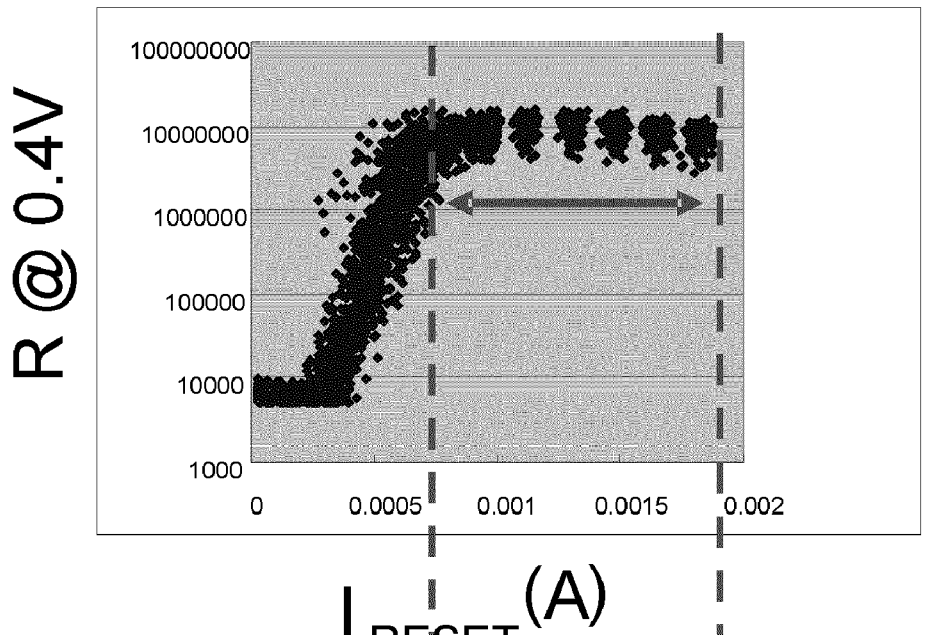
FIG. 14A is a plot of the measured resistance of a number of memory cells in the high resistance state versus the magnitude of the reset current used to establish the high resistance state.

FIG. 14A is the measured resistance of mushroom-type memory cells in the high resistance state versus the magnitude of the reset current $I_{RESET}$ used to establish the high resistance state. The data in FIG. 14A was measured using a voltage of 0.4 Volts.

As shown in FIG. 14A, for a reset current having a magnitude of less than about 0.7 mA, the resistance of the memory cells increases as the magnitude of the reset current $I_{RESET}$ increases. Accordingly, using a reset current $I_{RESET}$ having a magnitude less than 0.7 mA only partially resets the memory cells, such that the memory cells have a relatively small amount of amorphous phase material. Thus, memory cells reset using a reset current $I_{RESET}$ having a magnitude less than 0.7 mA are representative of defect cells and exhibit poor data retention characteristics.

As the magnitude of the reset current $I_{RESET}$ is increased above 0.7 mA, the resistance of the memory cells stabilizes and is no longer substantially affected by further increases in the magnitude. Thus, memory cells reset using a reset current $I_{RESET}$ above 0.7 mA are fully reset or over-reset and have a sufficiently large amount of amorphous phase material, and will not exhibit the poor data retention characteristics of defect cells.

Figure 14B:
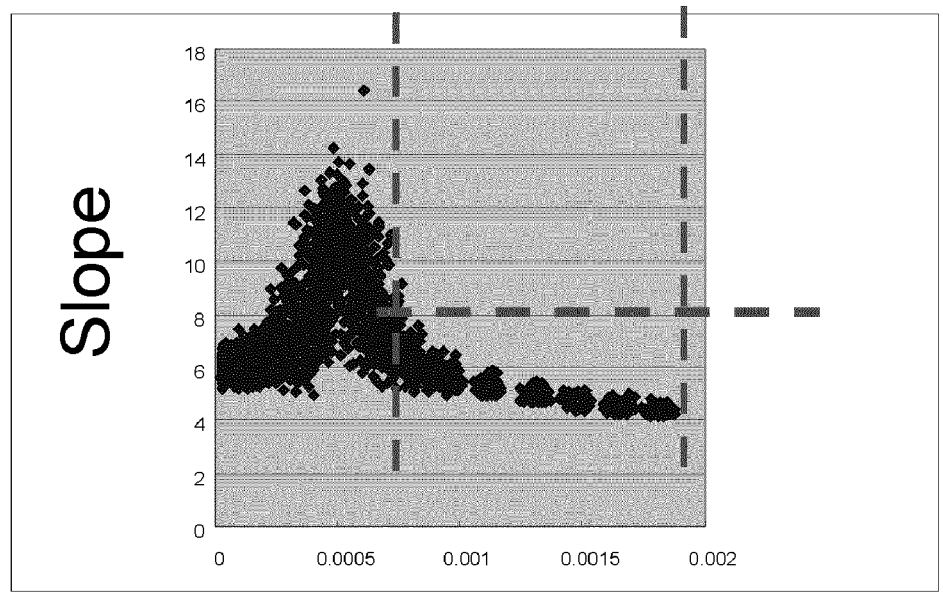
FIG. 14B is a plot of the slope of the measured current-voltage behavior of FIG. 14A.
Figure 14C:
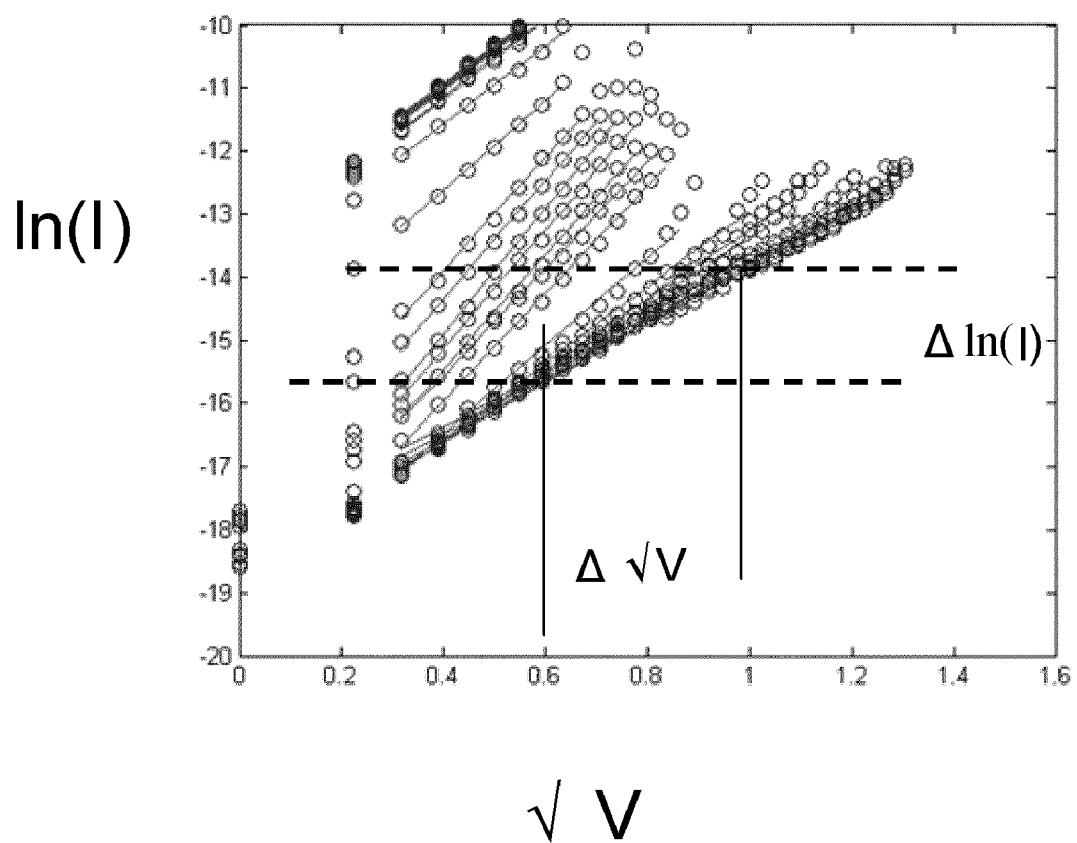
FIG. 14C is a plot of the natural log of the measured current versus the square root of the voltage.

FIG. 14B is a plot of the slope of the current-voltage behavior of the data of FIG. 14A versus the magnitude of the reset current $I_{RESET}$. The slope in FIG. 14B was calculated using the following equation:

$$\text{Slope} = \frac{\Delta \ln(I)}{\Delta \sqrt{V}} = \frac{\ln(I_A) - \ln(I_B)}{\sqrt{V_A} - \sqrt{V_B}}$$

where $V_A$ is the first voltage, $V_B$ is the second voltage, $I_A$ is the first current induced by the first voltage, and $I_B$ is the second current induced by the second voltage. In the data of FIG. 14B, $V_A$ is 0.6 Volts and $V_B$ is 1.0 Volts, FIG. 14C is a plot of the natural log (ln) of the measured current versus the square root of the voltage for a reset current having a magnitude of 0 µA to 1.8 mA applied to the same memory cell.

As described above in connection with in FIG. 14A, memory cells reset using a reset current $I_{RESET}$ having a magnitude above 0.7 mA are fully reset or over-reset, and thus which do not exhibit the poor data retention characteristics of defect cells. As shown in FIG. 14B, the memory cells reset using a reset current $I_{RESET}$ having a magnitude above 0.7 mA have a slop of less than about 8. Therefore, in this example the particular value of 8 for the slope can be used to determine whether a memory cell is a defect cell. The particular value will vary from embodiment to embodiment.

Embodiments of the memory cells described herein include phase change based memory materials, including chalcogenide based materials and other materials, for the programmable resistance memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as Te$_a$Ge$_b$Sb$_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include Ge$_2$Sb$_2$Te$_5$, GeSb$_2$Te$_4$ and GeSb$_4$Te$_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is Ge$_2$Sb$_2$Te$_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide (WO$_x$), NiO, Nb$_2$O$_5$, CuO$_2$, Ta$_2$O$_5$, Al$_2$O$_3$, CoO, Fe$_2$O$_3$, HfO$_2$, TiO$_2$, SrTiO$_3$, (BaSr)TiO$_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, CrO2, MnOFe2O3, FeOFe2O5, NiOFe2O3, MgOFe2, EuO, and Y3Fe5O12. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, N$_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell comprising memory material and programmable to a plurality of resistance states including a higher resistance state and a lower resistance state, the method comprising:
    applying a first bias arrangement to the memory cell to establish the higher resistance state;
    after applying the first biasing arrangement, applying a first voltage to the memory cell to induce a first current in the memory cell;
    after applying the first biasing arrangement, applying a second voltage to the memory cell to induce a second current in the memory cell, the second voltage different from the first voltage; and
    if the first and second currents differ by a threshold, then applying a second bias arrangement to the memory cell to establish the higher resistance state.

2. The method of claim 1, wherein the memory material comprises phase change material.

3. The method of claim 1, including determining if the first and second currents differ by a threshold by determining whether a ratio of a difference between the first and second currents to a difference between the first and second voltages is above a particular ratio.

4. The method of claim 2, wherein a condition in which the first and second currents differ by the threshold indicates an amount of amorphous phase change material within an active region of the phase change material of the memory cell.

5. The method of claim 1, further comprising after said applying the second bias arrangement, the steps of:
    applying a third voltage to the memory cell to induce a third current in the memory cell;
    applying a fourth voltage to the memory cell to induce a fourth current in the memory cell; and
    if the third and fourth currents differ by said threshold or by a different threshold, then applying a third bias arrangement to the memory cell to establish the higher resistance state based on the first and second currents.

6. The method of claim 5, further comprising iterating the steps of applying the third and fourth voltages and the third bias arrangement, until a difference between the third and fourth currents is below said threshold or said different threshold, or a particular number of retries are made.

7. The method of claim 6, further comprising replacing the memory cell with a replacement cell if the particular number of retries are made.

8. The method of claim 1, wherein:
    the first bias arrangement induces a first reset current in the memory cell; and
    the second bias arrangement induces a second reset current in the memory cell, the second reset current having a magnitude greater than that of the first reset current.

9. A memory device comprising:
    a memory cell comprising memory material and programmable to a plurality of resistance states including a higher resistance state and a lower resistance state;
    bias circuitry to apply a first bias arrangement to the memory cell to establish the higher resistance state, after applying the first biasing arrangement, to apply a first voltage to the memory cell to induce a first current in the memory cell, after applying the first biasing arrangement, to apply a second voltage to the memory cell different from the first voltage to induce a second current in the memory cell, and if the first and second currents differ by a threshold, then to apply a second bias arrangement to the memory cell to establish the higher resistance state; and
    sense circuitry to sense the first and second currents.

10. The memory device of claim 9, wherein the memory material comprises phase change material.

11. The memory device of claim 9, wherein said selectively applying the second bias arrangement is in response to a command signal.

12. The memory device of claim 11, further comprising control circuitry which generates the command signal based on the sensed first and second currents.

13. The memory device of claim 12, wherein the control circuitry generates the command signal if a difference between the first and second currents is above a threshold.

14. The memory device of claim 12, wherein the control circuitry generates the command signal if a ratio of a difference between the first and second currents to a difference between the first and second voltages is above a particular ratio.

15. The memory device of claim 13, wherein:
    the memory material comprises phase change material; and
    said difference indicates an amount of amorphous phase change material within an active region of the phase change material of the memory cell.

16. The memory device of claim 9, wherein:
    said bias circuitry further to apply after applying the second bias arrangement, a third voltage to the memory cell to induce a third current in the memory cell, to apply a fourth voltage to the memory cell to induce a fourth current in the memory cell, and apply a third bias arrangement to the memory cell to establish the higher resistance state in response to a second command signal, and if the third and fourth currents differ by said threshold or a different threshold, then to apply a third bias arrangement to the memory cell to establish the higher resistance state.

17. The memory device of claim 16, wherein said bias circuitry iteratively applies the third and fourth voltages and the third bias arrangement, until said third and fourth currents differ by said threshold or said different threshold or a particular number of retries are made.

18. The memory device of claim 17, further comprising:
    an array of memory cells including said memory cell; and
    a set of replacement cells to provide replacements for memory cells in the array, and wherein the control circuitry includes resources for replacing said memory cell with a replacement cell in the set of replacement cells if the particular number of retries are made.

19. The memory device of claim 9, wherein:

the first bias arrangement induces a first reset current in the memory cell; and the second bias arrangement induces a second reset current in the memory cell, the second reset current having a magnitude greater than that of the first reset current.

20. The memory device of claim 16, wherein:

said sense circuitry further senses the third and fourth currents, and generates a second command signal if a difference between the third and fourth currents is above said threshold or said different threshold.

* * * * *